(12) United States Patent
Messier

(10) Patent No.: US 11,567,108 B2
(45) Date of Patent: Jan. 31, 2023

(54) MULTI-GAIN CHANNELS FOR MULTI-RANGE SENSOR

(71) Applicant: Allegro MicroSystems, LLC, Manchester, NH (US)

(72) Inventor: Loïc André Messier, Chene-en-Semine (FR)

(73) Assignee: Allegro MicroSystems, LLC, Manchester, NH (US)

(*) Notice: Subject to any disclaimer, the term of this patent is extended or adjusted under 35 U.S.C. 154(b) by 43 days.

(21) Appl. No.: 17/218,783

(22) Filed: Mar. 31, 2021

(65) Prior Publication Data
US 2022/0317160 A1 Oct. 6, 2022

(51) Int. Cl.
*G01R 15/20* (2006.01)

(52) U.S. Cl.
CPC ......... *G01R 15/202* (2013.01); *G01R 15/205* (2013.01)

(58) Field of Classification Search
CPC .... G01R 15/20; G01R 15/202; G01R 15/205; G01R 33/0017; G01R 33/09; G01R 33/12; G01R 33/07; G01R 33/075; G01R 33/1246; G01D 5/14; G01D 5/145; G01D 5/142; G01D 5/147; G01D 5/2448
See application file for complete search history.

(56) References Cited

U.S. PATENT DOCUMENTS

| | | | |
|---|---|---|---|
| 4,283,643 A | 8/1981 | Levin | |
| 4,343,026 A | 8/1982 | Griffith et al. | |
| 4,385,273 A | 5/1983 | Leinhard et al. | |
| 4,525,668 A | 6/1985 | Lienhard et al. | |
| 4,596,950 A | 6/1986 | Lienhard et al. | |
| 4,691,259 A | 9/1987 | Imakoshi | |
| 4,712,064 A | 12/1987 | Eckardt et al. | |
| 4,772,929 A | 9/1988 | Manchester | |
| 4,823,075 A | 4/1989 | Alley | |

(Continued)

FOREIGN PATENT DOCUMENTS

| | | |
|---|---|---|
| CH | 683469 A5 | 3/1994 |
| DE | 3133908 A1 | 7/1982 |

(Continued)

OTHER PUBLICATIONS

U.S. Appl. No. 17/015,332, filed Sep. 9, 2020, Foroutan et al.

(Continued)

*Primary Examiner* — Son T Le
(74) *Attorney, Agent, or Firm* — Daly, Crowley, Mofford & Durkee, LLP

(57) ABSTRACT

A current sensor including: a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit; a first signal processing path coupled to the sensing unit, the first signal processing path including a first compensation unit for adjusting the internal signal, the first signal processing path being configured to generate a first signal based on the internal signal; a second signal processing path coupled to the sensing unit, the second signal processing path including a second compensation unit for adjusting the internal signal, the second path having a different sensitivity than the first path.

15 Claims, 11 Drawing Sheets

(56) References Cited

U.S. PATENT DOCUMENTS

| | | |
|---|---|---|
| 4,847,584 A | 7/1989 | Pant |
| 4,893,027 A | 1/1990 | Kammerer et al. |
| 4,922,606 A | 5/1990 | Alexander et al. |
| 4,926,116 A | 5/1990 | Talisa |
| 4,937,521 A | 6/1990 | Yoshino et al. |
| 4,939,448 A | 7/1990 | Gudel |
| 4,939,449 A | 7/1990 | Cattaneo et al. |
| 4,939,459 A | 7/1990 | Akachi et al. |
| 5,041,780 A | 8/1991 | Rippel |
| 5,049,809 A | 9/1991 | Wakatsuki et al. |
| 5,055,785 A | 10/1991 | Shintaku et al. |
| 5,218,279 A | 6/1993 | Takahashi et al. |
| 5,227,721 A | 7/1993 | Kataoka et al. |
| 5,247,202 A | 9/1993 | Popovic et al. |
| 5,351,027 A | 9/1994 | Kawamata et al. |
| 5,442,283 A | 8/1995 | Vig et al. |
| 5,500,590 A | 3/1996 | Pant |
| 5,561,366 A | 10/1996 | Takahaski et al. |
| 5,561,368 A | 10/1996 | Dovek et al. |
| 5,570,034 A | 10/1996 | Needham et al. |
| 5,583,725 A | 12/1996 | Coffey et al. |
| 5,621,377 A | 4/1997 | Dettmann et al. |
| 5,686,838 A | 11/1997 | van den Berg |
| 5,686,879 A | 11/1997 | Schuhl et al. |
| 5,719,494 A | 2/1998 | Dettmann et al. |
| 5,831,426 A | 11/1998 | Black, Jr. et al. |
| 5,861,747 A | 1/1999 | Kubinski |
| 5,877,705 A | 3/1999 | Sampey |
| 5,883,567 A | 3/1999 | Mullins, Jr. |
| 5,896,030 A | 4/1999 | Hasken |
| 5,945,825 A | 8/1999 | Clemens |
| 5,952,825 A | 9/1999 | Wan |
| 6,002,553 A | 12/1999 | Stearns et al. |
| 6,031,273 A | 2/2000 | Torok et al. |
| 6,094,330 A | 7/2000 | Criniti et al. |
| 6,100,686 A | 8/2000 | Van Delden et al. |
| 6,175,296 B1 | 1/2001 | Tokunaga et al. |
| 6,184,679 B1 | 2/2001 | Popovic et al. |
| 6,191,581 B1 | 2/2001 | Van Dau et al. |
| 6,300,617 B1 | 10/2001 | Daughton et al. |
| 6,310,470 B1 | 10/2001 | Hebing et al. |
| 6,315,875 B1 | 11/2001 | Sasaki |
| 6,316,931 B1 | 11/2001 | Nakagawa et al. |
| 6,323,634 B1 | 11/2001 | Nakagawa et al. |
| 6,329,818 B1 | 12/2001 | Tokunaga et al. |
| 6,331,773 B1 | 12/2001 | Engel |
| 6,356,068 B1 | 3/2002 | Steiner et al. |
| 6,392,852 B1 | 5/2002 | Sasaki |
| 6,404,191 B2 | 6/2002 | Daughton et al. |
| 6,411,078 B1 | 6/2002 | Nakagawa et al. |
| 6,424,018 B1 | 7/2002 | Ohtsuka |
| 6,426,620 B1 | 7/2002 | Taguchi et al. |
| 6,429,640 B1 | 8/2002 | Daughton et al. |
| 6,433,981 B1 | 8/2002 | Fletcher et al. |
| 6,437,558 B2 | 8/2002 | Li et al. |
| 6,445,171 B2 | 9/2002 | Sandquist et al. |
| 6,459,255 B1 | 10/2002 | Tamai et al. |
| 6,462,531 B1 | 10/2002 | Ohtsuka |
| 6,462,541 B1 | 10/2002 | Wang et al. |
| 6,501,678 B1 | 12/2002 | Lenssen et al. |
| 6,542,375 B1 | 4/2003 | Kuitenbrouwer et al. |
| 6,545,457 B2 | 4/2003 | Goto et al. |
| 6,566,856 B2 | 5/2003 | Sandquist et al. |
| 6,583,629 B1 | 6/2003 | Stokes et al. |
| 6,591,481 B2 | 7/2003 | Shimazawa et al. |
| 6,642,705 B2 | 11/2003 | Kawase |
| 6,657,826 B2 | 12/2003 | Shimazawa et al. |
| 6,667,682 B2 | 12/2003 | Wan et al. |
| 6,683,448 B1 | 1/2004 | Ohtsuka |
| 6,721,140 B2 | 4/2004 | Inoue et al. |
| 6,759,841 B2 | 7/2004 | Goto et al. |
| 6,769,166 B1 | 8/2004 | Blanchard |
| 6,781,358 B2 | 8/2004 | Goto et al. |
| 6,781,359 B2 | 8/2004 | Stauth et al. |
| 6,791,313 B2 | 9/2004 | Ohtsuka |
| 6,812,687 B1 | 11/2004 | Ohtsuka |
| 6,815,944 B2 | 11/2004 | Vig et al. |
| 6,841,989 B2 | 1/2005 | Goto et al. |
| 6,970,333 B2 | 11/2005 | Boeve |
| 6,989,665 B2 | 1/2006 | Goto |
| 6,995,315 B2 | 2/2006 | Sharma et al. |
| 6,995,957 B2 | 2/2006 | Jayasekara |
| 7,026,808 B2 | 4/2006 | Vig et al. |
| 7,075,287 B1 | 7/2006 | Mangtani et al. |
| 7,106,046 B2 | 9/2006 | Nagano et al. |
| 7,166,807 B2 | 1/2007 | Gagnon et al. |
| 7,248,045 B2 | 7/2007 | Shoji |
| 7,259,545 B2 | 8/2007 | Stauth et al. |
| 7,265,531 B2 | 9/2007 | Stauth et al. |
| 7,336,064 B2 | 2/2008 | Ludwig et al. |
| 7,358,724 B2 | 4/2008 | Taylor et al. |
| 7,476,816 B2 | 1/2009 | Doogue et al. |
| 7,476,953 B2 | 1/2009 | Taylor et al. |
| 7,495,624 B2 | 2/2009 | Daalmans |
| 7,518,354 B2 | 4/2009 | Stauth et al. |
| 7,598,601 B2 | 10/2009 | Taylor et al. |
| 7,709,754 B2 | 5/2010 | Doogue et al. |
| 7,723,983 B2 | 5/2010 | Shoji |
| 7,746,056 B2 | 6/2010 | Stauth et al. |
| 7,768,083 B2 | 8/2010 | Doogue et al. |
| 7,816,905 B2 | 10/2010 | Doogue et al. |
| 7,923,996 B2 | 4/2011 | Doogue et al. |
| 7,973,527 B2 | 7/2011 | Taylor et al. |
| 8,030,918 B2 | 10/2011 | Doogue et al. |
| 8,063,634 B2 | 11/2011 | Sauber et al. |
| 8,080,994 B2 | 12/2011 | Taylor et al. |
| 8,269,491 B2 | 9/2012 | Cummings et al. |
| 8,542,010 B2 | 9/2013 | Cesaretti et al. |
| 8,629,520 B2 | 1/2014 | Doogue et al. |
| 8,680,846 B2 | 3/2014 | Cesaretti et al. |
| 8,692,546 B2 | 4/2014 | Cesaretti et al. |
| 8,907,669 B2 | 12/2014 | Petrie |
| 8,952,471 B2 | 2/2015 | Doogue et al. |
| 9,046,562 B2 | 6/2015 | Cummings et al. |
| 9,082,957 B2 | 7/2015 | Doogue et al. |
| 9,201,122 B2 | 12/2015 | Cesaretti et al. |
| 9,638,764 B2 | 5/2017 | Cesaretti et al. |
| 9,645,220 B2 | 5/2017 | Cesaretti et al. |
| 9,812,637 B2 | 11/2017 | Fermon et al. |
| 9,851,417 B2 | 12/2017 | Kosier et al. |
| 9,859,489 B2 | 1/2018 | Doogue et al. |
| 9,910,088 B2 | 3/2018 | Milano et al. |
| 10,069,063 B2 | 9/2018 | Doogue et al. |
| 10,073,136 B2 | 9/2018 | Milano et al. |
| 10,107,873 B2 | 10/2018 | Cesaretti |
| 10,114,044 B2 | 10/2018 | Geisler et al. |
| 10,114,085 B2 | 10/2018 | Eagen et al. |
| 10,120,017 B2 | 11/2018 | Moody et al. |
| 10,132,879 B2 | 11/2018 | Latham et al. |
| 10,162,017 B2 | 12/2018 | Cesaretti |
| 10,247,758 B2 | 4/2019 | Milano et al. |
| 10,254,354 B2 | 4/2019 | Cesaretti |
| 10,380,879 B2 | 8/2019 | Haas et al. |
| 10,488,458 B2 | 11/2019 | Milano et al. |
| 10,509,058 B2 | 12/2019 | Cadugan et al. |
| 10,520,559 B2 | 12/2019 | Cesaretti et al. |
| 10,578,684 B2 | 3/2020 | Cadugan et al. |
| 10,580,289 B2 | 3/2020 | Haas et al. |
| 10,605,874 B2 | 3/2020 | Lassalle-Balier et al. |
| 10,692,362 B2 | 6/2020 | Petrie et al. |
| 10,746,817 B2 | 8/2020 | Kosier et al. |
| 10,746,818 B2 | 8/2020 | Cesaretti |
| 10,908,232 B2 | 2/2021 | Latham et al. |
| 10,914,765 B1 | 2/2021 | Bussing et al. |
| 10,935,612 B2 | 3/2021 | Belin et al. |
| 2002/0067162 A1 | 6/2002 | Dammkohler et al. |
| 2002/0067172 A1 | 6/2002 | Alker |
| 2002/0084105 A1 | 7/2002 | Geng et al. |
| 2002/0093332 A1 | 7/2002 | Schroeder et al. |
| 2002/0158345 A1 | 10/2002 | Hedler et al. |
| 2002/0180433 A1 | 12/2002 | Van Zon et al. |
| 2003/0043555 A1 | 3/2003 | Goller et al. |
| 2003/0047760 A1 | 3/2003 | Daeche et al. |
| 2003/0047813 A1 | 3/2003 | Goller et al. |

(56) References Cited

U.S. PATENT DOCUMENTS

| | | | |
|---|---|---|---|
| 2003/0151406 A1 | 8/2003 | Wan et al. | |
| 2004/0023064 A1 | 2/2004 | Ehresmann et al. | |
| 2004/0027891 A1 | 2/2004 | Hartmann | |
| 2004/0184196 A1 | 9/2004 | Jayasekara | |
| 2005/0194674 A1 | 9/2005 | Thomas et al. | |
| 2005/0246114 A1 | 11/2005 | Rannow et al. | |
| 2005/0248883 A1 | 11/2005 | Skoufis | |
| 2005/0258820 A1 | 11/2005 | Forster | |
| 2005/0280036 A1 | 12/2005 | Schroeder et al. | |
| 2006/0033487 A1 | 2/2006 | Nagano et al. | |
| 2006/0071655 A1 | 4/2006 | Shoji | |
| 2006/0077598 A1 | 4/2006 | Taylor et al. | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0175674 A1 | 8/2006 | Taylor et al. | |
| 2006/0255797 A1 | 11/2006 | Taylor et al. | |
| 2006/0284611 A1 | 12/2006 | Ishio | |
| 2006/0291106 A1 | 12/2006 | Shoji | |
| 2007/0025027 A1 | 2/2007 | Chung et al. | |
| 2007/0044370 A1 | 3/2007 | Shoji | |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0188946 A1 | 8/2007 | Shoji | |
| 2009/0315543 A1 | 12/2009 | Guo et al. | |
| 2010/0106452 A1 | 4/2010 | Tatenuma et al. | |
| 2015/0192648 A1 | 7/2015 | Campiglio et al. | |
| 2015/0323568 A1 | 11/2015 | Schmitt | |
| 2017/0108536 A1 | 4/2017 | Hebiguchi | |
| 2017/0184635 A1 | 6/2017 | Ugge et al. | |
| 2018/0203059 A1* | 7/2018 | Sacco | G01D 5/24466 |
| 2018/0306843 A1 | 10/2018 | Bussing et al. | |
| 2019/0025346 A1 | 1/2019 | Latham | |
| 2020/0018780 A1 | 1/2020 | Cadugan et al. | |
| 2020/0049760 A1 | 2/2020 | Milano et al. | |
| 2020/0057120 A1* | 2/2020 | Belin | G01R 33/098 |

FOREIGN PATENT DOCUMENTS

| | | |
|---|---|---|
| DE | 4212737 C1 | 7/1993 |
| DE | 19680089 T1 | 4/1997 |
| DE | 19650078 A1 | 6/1998 |
| DE | 10017374 A1 | 12/2000 |
| DE | 10108640 A1 | 9/2002 |
| DE | 10159607 A1 | 9/2002 |
| DE | 10120408 A1 | 10/2002 |
| DE | 10128150 C1 | 1/2003 |
| DE | 10142114 C1 | 2/2003 |
| DE | 10142118 A1 | 3/2003 |
| DE | 10143437 A1 | 3/2003 |
| DE | 10155423 A1 | 5/2003 |
| DE | 10202287 C1 | 8/2003 |
| DE | 10222395 A1 | 12/2003 |
| DE | 10228764 A1 | 1/2004 |
| DE | 10314602 A1 | 10/2004 |
| DE | 102004003369 A1 | 8/2005 |
| DE | 102004009267 B3 | 9/2005 |
| DE | 102004038847 B3 | 9/2005 |
| DE | 102004017191 A1 | 10/2005 |
| DE | 102005010156 A1 | 10/2005 |
| DE | 102004021862 A1 | 12/2005 |
| DE | 102004027273 A1 | 12/2005 |
| DE | 102004040079 B3 | 12/2005 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 A1 | 3/2007 |
| DE | 102005052688 A1 | 5/2007 |
| DE | 102006007770 A1 | 8/2007 |
| DE | 102006028250 A1 | 12/2007 |
| DE | 102006028698 B3 | 12/2007 |
| DE | 102006046736 A1 | 4/2008 |
| DE | 102006046739 A1 | 4/2008 |
| EP | 0539081 A1 | 4/1993 |
| EP | 0710850 A2 | 5/1996 |
| EP | 1111693 A2 | 6/2001 |
| EP | 1202024 A1 | 5/2002 |
| EP | 1225453 A2 | 7/2002 |
| EP | 1273921 A1 | 1/2003 |
| EP | 1443332 A1 | 8/2004 |
| EP | 1111693 A3 | 10/2004 |
| EP | 1691204 A1 | 8/2006 |
| EP | 1720027 A1 | 11/2006 |
| EP | 1865331 A2 | 12/2007 |
| EP | 2891893 | 7/2015 |
| FR | 2749664 A1 | 12/1997 |
| FR | 2860592 A1 | 4/2005 |
| GB | 2352522 A | 1/2001 |
| JP | S 5687273 | 7/1981 |
| JP | S 57105977 | 6/1982 |
| JP | S 57187671 | 11/1982 |
| JP | S 58155761 | 9/1983 |
| JP | S 63150384 | 10/1988 |
| JP | S 63263782 A | 10/1988 |
| JP | S 6475969 | 3/1989 |
| JP | H 01251763 | 10/1989 |
| JP | H 0216475 | 1/1990 |
| JP | H 02170061 A | 6/1990 |
| JP | H 02212789 | 8/1990 |
| JP | H 02238372 | 9/1990 |
| JP | H 03214783 | 9/1991 |
| JP | H 04302406 | 10/1992 |
| JP | H 05010979 | 1/1993 |
| JP | H 05264701 | 10/1993 |
| JP | H 0627150 | 2/1994 |
| JP | H 08130338 | 5/1996 |
| JP | H 09166612 | 6/1997 |
| JP | H 09257835 A | 10/1997 |
| JP | H 10142303 | 5/1998 |
| JP | H 10293141 | 11/1998 |
| JP | H 10307156 A | 11/1998 |
| JP | 2000193728 | 7/2000 |
| JP | 2001227902 | 8/2001 |
| JP | 2001230598 | 8/2001 |
| JP | 2002082136 | 3/2002 |
| JP | 2002-107382 | 4/2002 |
| JP | 2003043074 | 2/2003 |
| JP | 2003215171 | 7/2003 |
| JP | 2004132790 | 4/2004 |
| JP | 2004158668 | 6/2004 |
| JP | 2004356338 A | 12/2004 |
| JP | 2005195427 | 7/2005 |
| JP | 2005253216 | 9/2005 |
| JP | 5902657 | 4/2016 |
| KR | 10-2008-0033957 | 4/2008 |
| WO | WO 94/06030 | 3/1994 |
| WO | WO 96/22542 | 7/1996 |
| WO | WO 98/01764 | 1/1998 |
| WO | WO 02/069400 A1 | 9/2002 |
| WO | WO 03/019216 | 3/2003 |
| WO | WO 2003/107018 A1 | 12/2003 |
| WO | WO 2004/072672 A1 | 8/2004 |
| WO | WO 2004/109725 | 12/2004 |
| WO | WO 2005/059967 A2 | 6/2005 |
| WO | WO 2005/081007 A1 | 9/2005 |
| WO | WO 2006/044031 A1 | 4/2006 |
| WO | WO 2006/083479 A1 | 8/2006 |
| WO | WO 2006/117727 A1 | 11/2006 |
| WO | WO 2006/136577 A1 | 12/2006 |
| WO | WO 2007/087121 A2 | 8/2007 |
| WO | WO 2007/087121 A3 | 8/2007 |
| WO | WO 2007/147760 A2 | 12/2007 |
| WO | WO 2009/148823 A1 | 12/2009 |

(56) References Cited

FOREIGN PATENT DOCUMENTS

| WO | WO 2012070337 | 5/2012 |
|---|---|---|
| WO | WO 2017/199519 | 11/2017 |

OTHER PUBLICATIONS

U.S. Appl. No. 17/350,045, filed Jun. 17, 2021, Latham et al.
JP Office Action dated Jul. 2, 2012; for Japanese Pat. App. No. 2008-551281; 5 pages.
JP Response to Office Action filed on Oct. 4, 2012; for Japanese Pat. App. No. 2008-551281; 11 pages.
JP Decision for Declining of Amendment; dated Sep. 27, 2012; for Japanese Pat. App. No. 2008-551281; 2 pages.
JP Decision for Rejection; dated May 16, 2013; for Japanese Pat. App. No. 2008-551281; 1 page.
Letter from Yuasa & Hara dated May 29, 2013; for Japanese Pat. App. No. 2008-551281; 3 pages.
JP Appeal Brief and Amendment (in Japanese); dated Sep. 12, 2013; for JP Pat. App. No. 2008-551281; 11 pages.
JP Claims (English Translation) as filed with Appeal Brief and Amendment; dated Sep. 12, 2013; for JP Pat. App. No. 2008-551281; 2 pages.
Letter from Yuasa and Hara dated Sep. 25, 2013; for JP Pat. App. No. 2008-551281; 1 page.
JP Notification of Reason for Rejection dated Sep. 29, 2014; for Japanese Pat. App. No. 2008-551281; 2 pages.
Letter to Yuasa and Hara dated Dec. 4, 2014 for Japanese Pat. App. No. 2008-551281; 1 page.
JP Claims (English translation) as filed with Response on Dec. 9, 2014; for Japanese Pat. App. No. 2008-551281; 2 pages.
Letter to Yuasa and Hara dated Mar. 23, 2015; for Japanese Pat. App. No. 2008-551281; 3 pages.
JP Argument and Amendment filed Mar. 31, 2015(in Japanese); for Japanese Pat. App. No. 2008-551281; 4 pages.
JP Claims as filed with Argument and Amendment (English translation) filed Mar. 31, 2015; for Japanese Pat. App. No. 2008-551281; 2 pages.
Letter from Yuasa and Hara dated Apr. 3, 2015; for Japanese Pat. App. No. 2008-551281; 2 pages.
KR Office Action with a Summary of the Office Action in English; dated Nov. 13, 2012; for KR Pat. App. No. 10-2008-7018642; 21 pages.
Letter to 21$^{st}$ Century Patent & Law Firm dated Dec. 14, 2012; including "DCMD Proposed Amended Claims Beginning From PCT Claims;" for Korean Patent Application No. 10-2008-7018642; 21 pages.
Letter to 21$^{st}$ Century Patent & Law Firm dated Jun. 25, 2013; for KR Pat. App. No. 10-2008-7018642; 4 pages.
KR Response to Office Action; filed Jul. 17, 2013; for KR Pat. App. No. 10-2008-7018642; 19 pages.
KR Notice of Allowance (with English translation) dated Nov. 20, 2013; for Korean Pat. App. No. 10-2008-7018642; 3 pages.
KR Allowed Claims (English translation) dated Nov. 20, 2013; for Korean Pat. App. No. 10-2008-7018642; 17 pages.
Office Action dated May 19, 2011; for U.S. Appl. No. 12/792,245; 21 pages.
Response filed Aug. 16, 2011; to Office Action dated May 19, 2011; for U.S. Appl. No. 12/792,245; 14 pages.
Final Office Action dated Oct. 28, 2011; for U.S. Appl. No. 12/792,245; 23 pages.
Response filed Dec. 29, 2011; to Final Office Action dated Oct. 28, 2011; for U.S. Appl. No. 12/792,245; 14 pages.
Request for Continued Examination; filed on Feb. 16, 2012; for U.S. Appl. No. 12/792,245; 3 pages.
Office Action dated Mar. 28, 2013; for U.S. Appl. No. 12/792,245; 18 pages.
Response filed Apr. 25, 2013; to Office Action dated Mar. 28, 2013; for U.S. Appl. No. 12/792,245; 21 pages.

Notice of Allowance dated May 31, 2013; for U.S. Appl. No. 12/792,245; 10 pages.
Notice of Allowance; dated Sep. 16, 2013; for U.S. Appl. No. 12/792,245; 11 pages.
EP Extended Search Report dated Feb. 1, 2011 for EP Pat. App. No. 10195143.2; 9 pages.
EP Response to Official Communication; dated Mar. 7, 2011; for EP Pat. App. No. 10195143.2; filed on Sep. 1, 2011; 46 pages.
EP Notice of Allowance; dated Oct. 28, 2011; for EP Pat. App. No. 10 195 143.2; 7 pages.
EP Notice of Opposition (in German) from the European Patent Office; dated Jan. 15, 2013; with regard to EP Pat. App. No. 10195143.2; 50 pages.
Letter from A.A.Thornton & Co.; dated Feb. 20, 2013; with regard to EP Pat. No. 10195143.2; 2 pages.
Letter from A.A. Thornton & Co. to the European Patent Office; dated Aug. 8, 2013; for European Pat. App. No. 2290379; 1 page.
EP Response to the Opposition by Micronas GmbH; for European Pat. No. 2290379; 15 pages.
EP Summons to Attend Oral Proceedings and Summary of Facts and Submission dated Feb. 16, 2015; for European Pat. App. No. 10195143.2; 12 pages.
Letter from Koch Muller dated Sep. 8, 2015; For European Pat. No. EP 2 290 379 B1; 6 pages.
Response (with First, Second and Third Auxiliary Request Claims) to European Appeal Statement from the Opponent dated Dec. 17, 2015 for European Application No. 2290379; Response filed on Sep. 14, 2016; 15 Pages.
EP Provision of the Minutes in Accordance with Rule 124(4) EPC dated Dec. 17, 2015; For European Pat. No. 2290379; 16 pages.
Email from A. A. Thornton & Co. dated Feb. 12, 2016; For European Pat. No. 2290379; 2 pages.
Statement of Grounds of Appeal (following opposition); English Translation dated Apr. 25, 2016; European Patent No. EP 2290379 B1; 46 pages.
EPO Response to patent proprietor's submission filed on Oct. 17, 2017 for EP Patent No. EP 2290379 B1; 10 pages.
JP Notification of Rejection; dated Oct. 23, 2012; for JP Pat. App. No. 2011-264267; 3 sheets.
JP Response to Notification of Rejection (in Japanese); filed on Apr. 16, 2013; for Japanese Pat. App. No. 2011-264267; 6 pages.
Letter from Yuasa & Hara dated Apr. 25, 2013; for Japanese Pat. App. No. 2011-264267; 1 page.
JP Notification of Reason for Rejection; dated Aug. 19, 2013; for Japanese Pat. App. No. 2011-264267; 3 pages.
Letter from Yuasa & Hara dated Aug. 21, 2013; for Japanese Pat. App. No. 2011-264267; 2 pages.
JP Argument and Amendment filed Feb. 18, 2014 (in Japanese); for Japanese Pat. App. No. 2011-264267; 5 pages.
JP Claims (English translation) filed in Japanese Argument and Amendment filed Feb. 18, 2014; for Japanese Pat. App. No. 2011-264267; 4 pages.
Letter from Yuasa and Hara dated Feb. 25, 2014; for Japanese Pat. App. No. 2011-264267; 1 page.
JP Letter from Yuasa and Hara dated Sep. 19, 2014; for Japanese Pat. App. No. 2011-264267; 1 page.
Office Action dated Jan. 14, 2014; for U.S. Appl. No. 13/918,064; 36 pages.
Notice of Allowance dated May 27, 2014 from U.S. Appl. No. 13/918,064; 11 pages.
Corrected Notice of Allowability dated Sep. 2, 2014; for U.S. Appl. No. 13/918,064; 9 pages.
Notice of Allowance dated Sep. 15, 2014; from U.S. Appl. No. 13/918,064; 9 pages.
312 Amendment filed Oct. 22, 2014; for U.S. Appl. No. 13/918,064; 6 pages.
EP Extended Search Report dated Feb. 1, 2011 for EP Pat. App. No. 10195145.7; 5 pages.
EP Notice of Allowance; dated Oct. 28, 2011; for EP Pat. App. No. 10 195 145.7; 7 pages.
EP Notice of Opposition from the European Patent Office; dated Jan. 15, 2013; with regard to EP Pat. App. No. 10195145.7; 24 pages.

(56) References Cited

OTHER PUBLICATIONS

Letter from A.A.Thornton & Co.; dated Feb. 20, 2013; with regard to EP Pat. App. No. 10195145.7; 2 pages.
Letter from A.A. Thornton & Co. to the European Patent Office; dated Aug. 14, 2013; for European Pat. No. 10195145.7; 1 page.
EP Response to the Opposition by Micronas GmbH; for European Pat. No. 2290380; 10 pages.
EP Summons to Attend Oral Proceedings and Summary of Facts and Submission dated Feb. 17, 2015; for European Pat. App. No. 10195145.7; 10 pages.
Letter from Koch Muller dated Sep. 13, 2015; For European Pat. App. No. EP 2 290 380 B1; 9 pages.
EP Decision Rejecting the Opposition dated Dec. 15, 2015; For European Pat. No. 2290380; 11 pages.
EP Provision of the Minutes in Accordance with Rule 124(4) EPC dated Dec. 15, 2015; For European Pat. No. 2290380; 8 pages.
Email from A. A. Thornton & Co. dated Feb. 12, 2016; For European Pat. No. 2290380; 2 pages.
Statement of Grounds of Appeal (following opposition); English Translation; European Patent No. EP 2290380 B1; Apr. 25, 2016,20 pages.
Response (with First, Second and Third Auxiliary Request Claims) to European Appeal Statement from the Opponent dated Dec. 15, 2015 for European Application No. 2290380; Response filed on Sep. 14, 2016; 15 Pages.
EPO Response to patent proprietor's submission filed on Oct. 17, 2017 for EP Patent No. EP 2290380 B1; 6 pages.
JP Notification of Reason for Rejection (English Translation) dated Mar. 6, 2014; for Japanese Pat. App. No. 2013-085409; 3 pages.
Letter to Yuasa and Hara dated Aug. 8, 2014; for Japanese Pat. App. No. 2013-085409; 9 pages.
JP Argument and Amendment filed Aug. 26, 2014 (in Japanese); for Japanese Pat. App. No. 2013-085409; 7 pages.
JP Pending Amended Claims filed Aug. 26, 2014; for Japanese Pat. App. No. 2013-085409; 5 pages.
Letter from Yuasa and Hara dated Sep. 9, 2014; for Japanese Pat. App. No. 2013-085409; 1 page.
JP Decision for Rejection (English translation) dated Nov. 7, 2014; for Japanese Pat. App. No. 2013-085409; 2 pages.
Office Action dated Sep. 25, 2014; for U.S. Appl. No. 13/918,075; 47 pages.
Response filed Jan. 21, 2015; to Office Action dated Sep. 25, 2014; for U.S. Appl. No. 13/918,075; 13 pages.
Notice of Allowance dated Feb. 17, 2015; for U.S. Appl. No. 13/918,075; 17 pages.
EP Extended Search Report dated Feb. 1, 2011 for EP Pat. App. No. 10195147.3; 5 pages.
EP Response to Official Communication; dated Mar. 7, 2011; for EP Pat. App. No. 10195147.3; filed on Sep. 1, 2011; 27 pages.
EP Notice of Allowance; dated Nov. 14, 2011; for EP Pat. App. No. 10 195 147.3; 7 pages.
EP Notice of Opposition from the European Patent Office; dated Jan. 15, 2013; with regard to EP Pat. App. No. 10195147.3; 44 pages.
Letter from A.A.Thornton & Co.; dated Feb. 20, 2013; with regard to EP Pat. App. No. 10195147.3; 2 pages.
Letter from A.A. Thornton & Co. to the European Patent Office; dated Aug. 8, 2013; for European Pat. No. 2290381; 1 page.
EP Response to the Opposition by Micronas GmbH; for European Pat. App. No. 2290381; 9 pages.
EP Summons to Attend Oral Proceedings and Summary of Facts and Submission dated Feb. 23, 2015; for European Pat. No. 10195147.3; 12 pages.
Letter from Koch Muller dated Sep. 14, 2015; For European Pat. No. EP 2 290 381 B1; 11 pages.
EP Interlocutory Decision in Opposition Proceedings dated Dec. 17, 2015; For European Pat. No. 2 290 381; 38 pages.
EP Provision of the Minutes in Accordance with Rule 124(4) EPC dated Dec. 17, 2015; For European Pat. No. 2 290 381; 14 pages.
Email from A. A. Thornton & Co. dated Feb. 12, 2016; For European Pat. No. 2290381; 2 pages.
Statement of Grounds of Appeal (following opposition); English Translation; European Patent No. EP 2290379 B1; Apr. 27, 2016, 36 pages.
EP Patent Office Munich Response to Appeal dated Sep. 19, 2016; in opposition against Divisional European Patent No. 2290381, 15 pages.
EPO Response to patent proprietor's submission filed on Oct. 17, 2017 for EP Patent No. EP 2290381 B1; 10 pages.
JP Office Action dated May 15, 2014; Application No. 2013-189638; 6 pages.
Letter to Yuasa and Hara dated Nov. 11, 2014; for Japanese Pat. App. No. 2013-189638; 4 pages.
JP Amendment dated Nov. 18, 2014 9 (in Japanese); for Japanese Pat. App. No. 2013-189638; 6 pages.
JP Pending Claims filed Nov. 18, 2014; for Japanese Pat. App. No. 2013-189638; 4 pages.
Letter from Yuasa and Hara dated Nov. 27, 2014; for Japanese Pat. App. No. 2013-189638; 1 page.
JP Decision of Final Rejection (in Japanese);; for Japanese Pat. App. No. 2013-189638; 5 pages.
Appeal and Notice of Appeal (with English claims), dated Aug. 10, 2015, to Japanese Office Action; For Japanese Pat. App. No. 2013-189638; 13 pages.
Translation of Office Action dated Nov. 4, 2015; For Japanese Pat. App. No. 2013-189638; 1 page.
Letter from Yuasa and Hara dated Nov. 9, 2015; For Japanese Pat. App. No. 2013-189638; 3 pages.
Response with English translation of Claim Amendments dated Feb. 4, 2016 (in Japanese); to Japanese Office Action; For Japanese Pat. App. No. 2013-189638; 7 pages.
Letter from Yuasa and Hara dated Feb. 15, 2016; For Japanese Pat. App. No. 2013-189638; 2 pages.
Letter from Yuasa and Hara dated Feb. 24, 2016; For Japanese Pat. App. No. 2013-189638; 1 page.
Japanese NOA dated Feb. 24, 2016 with allowed claims (in Japanese); For Japanese Pat. App. No. 2013-189638; 5 pages.
Letter from Yuasa and Hara with Patented Claims dated May 11, 2016; For Japanese Pat. No. 5902657; 3 pages.
Office Action dated Jul. 21, 2016 for U.S. Appl. No. 14/707,319; 63 pages.
Response to Office Action filed Sep. 29, 2016 for U.S. Appl. No. 14/707,319; 13 pages.
Request for Continued Examination filed on Jan. 18, 2017 for U.S. Appl. No. 14/707,319; 2 pages.
Office Action dated Mar. 23, 2017 for U.S. Appl. No. 14/707,319; 17 pages.
Response to Office Action dated Mar. 23, 2017 filed on Jun. 2, 2017 for U.S. Appl. No. 14/707,319; 14 pages.
Notice of Allowance dated Oct. 30, 2017 for U.S. Appl. No. 14/707,319; 10 pages.
JP Notification of Reason for Rejection dated Nov. 14, 2014 (in Japanese); for Japanese Pat. App. No. 2014-028213; 6 pages.
JP Argument and Amendment filed May 13, 2015 (in Japanese); for Japanese Pat. App. No. 2014-028213; 12 pages.
JP Claims (English Translation) as filed with Japanese Argument and Amendment filed May 13, 2015; for Japanese Pat. App. No. 2014-028213; 7 pages.
Notice of Allowance with English Allowed Claims dated Oct. 26, 2015 (in Japanese); For Japanese Pat. App. No. 2014-028213; 9 pages.
Letter from Yuasa and Hara dated Oct. 28, 2015; For Japanese Pat. App. No. 2014-028213; 1 page.
Office Action dated Feb. 6, 2018 for U.S. Appl. No. 15/395,083; 14 pages.
Response to Office Action filed Mar. 23, 2018, 2018 for U.S. Appl. No. 15/395,083; 8 pages.
Notice of Allowance dated May 23, 2018 for U.S. Appl. No. 15/395,083; 8 pages.
JP Office Action with English Translation dated Feb. 22, 2016; For Japanese Pat. App. No. 2015-045607; 10 pages.

(56) References Cited

OTHER PUBLICATIONS

JP Response to Office Action dated Jun. 21, 2016 (in Japanese); For Pat. App. No. JP 2015-045607; 9 pages.
Letter from Yuasa and Hara dated Jun. 28, 2016; For Pat. App. No. JP 2015-045607; 2 pages.
New Claims on file dated Jun. 28, 2016; For Pat. App. No. JP 2015-045607; 10 pages.
Translation of Second Japanese Office Action with Reasons for Rejection dated Dec. 27, 2016; for Japanese Pat. Appl. No. 2015-045607; 5 pages.
Letter to Yuasa and Hara dated Jan. 30, 2017 for JP Pat. Appl. No. 2015-045607; 8 pages.
Letter to Yuasa and Hara dated Feb. 10, 2017 for JP Pat. Appl. No. 2015-045607; 6 pages.
Yuasa and Hara letter dated Feb. 10, 2017 regarding response for JP Appl. No. 2015-045607; 5 pages.
New Japanese Claims filed on Feb. 10, 2017 for JP Appl. No. 2015-045607; 11 pages.
Letter from Yuasa and Hara dated Feb. 17, 2017 for JP Appl. No. 2015-045607; 2 pages.
Decision of Final Rejection dated May 12, 2017 for JP Pat. Application No. 2015-45607; 5 pages.
Japanese Allowance Report dated Jun. 25, 2018 for Japanese Application No. JP 2015-045607; 1 Page.
Allowed Japanese Claims in English dated Jun. 25, 2018 for Japanese Application No. JP 2015-045607; 10 Pages.
Letter from Yuasa and Hara dated Sep. 15, 2017 for JP Appl. No. 2015-045607; 2 pages.
Japanese Office Action dated Jul. 29, 2016 with English translation, Application No. 2015-157901, 10 pages.
Response to Japanese Office Action dated Dec. 21, 2016 (in Japanese); for Japanese Application No. 2015-157901, 9 pages.
English Translation of New Claims filed on Dec. 21, 2016; for JP App. No. 2015-157901; 2 pages.
Letter from Yuasa and Hara dated Jan. 11, 2017 for JP Pat. App. No. 2015-157901; 2 pages.
Allowed Claims from Yuasa & Hara Allowance Report dated May 15, 2017 for JP Pat. Appl. No. 2015-157901; 2 pages.
New Japanese Claims filed on Sep. 13, 2017 for JP Appl. No. 2017-173831; 10 pages.
Letter from Yuasa and Hara dated Sep. 15, 2017 for JP Appl. No. 2017-173831; 3 pages.
Office Action dated Jan. 25, 2010 for U.S. Appl. No. 12/131,339; 12 pages.
Response to Office Action dated Jan. 25, 2010 and filed on Feb. 16, 2010 for U.S. Appl. No. 12/131,339; 10 pages.
Final Office Action dated Apr. 16, 2010 for U.S. Appl. No. 12/131,339; 15 pages.
Response to Final Office Action dated Apr. 16, 2010 and filed on Jul. 16, 2010 for U.S. Appl. No. 12/131,339; 13 pages.
Notice of Allowance dated Jul. 29, 2010 for U.S. Appl. No. 12/131,339; 9 pages.
PCT Search Report and Written Opinion of the ISA dated Nov. 5, 2009 for PCT/US2009/044614; 14 pages.
PCT International Preliminary Report on Patentability and Written Opinion dated Dec. 16, 2010 for PCT/US2009/044614; 7 pages.
Chinese Office Action dated Sep. 28, 2012 (in Chinese); for Chinese Pat. App. No. 200980115608.6; 5 pages.
Chinese Office Action; dated May 2, 2013 (in Chinese); for Chinese Pat. App. No. 200980115608.6; 9 pages.
Translation of Chinese Office Action; dated May 2, 2013; for Chinese Pat. App. No. 200980115608.6; 8 pages.
Letter from NTD Patent & Trademark Agency Limited; dated May 17, 2013; for Chinese Pat. App. No. 200980115608.6; 1 page.
Letter to NTD Patent and Trademark Agency Ltd.; dated Jun. 24, 2013; regarding Chinese Pat. App. No. 200980115608.6; 8 pages.
Chinese Response to Office Action; to Chinese Office Action dated May 2, 2013; for Chinese Pat. App. No. 200980115608.6; 8 pages.
Letter from NTD Patent and Trademark Agency Ltd.; dated Jul. 22, 2013; regarding Chinese Pat. App. No. 200980115608.6; 1 page.
Chinese Notice of Completing Formalities for Patent Registration and Notice of Granting Patent Right for Invention; dated Aug. 1, 2013; for Chinese Pat. App. No. 200980115608.6; 2 pages.
Letter to Kuhnen & Wacker dated Mar. 16, 2016; For German Pat. App. 112009001350.3; 2 pages.
Letter from Kuhnen & Wacker dated May 19, 2016; For German Pat. App. 112009001350.3; 2 pages.
Request for Examination dated Mar. 19, 2016 (in German); For German Pat. App. 112009001350.3; 13 pages.
JP Notice of Reasons for Rejection dated Jul. 25, 2013; for Japanese Pat. App. 2011-511715; 5 pages.
JP Argument and Amendment filed Oct. 23, 2013 (in Japanese); for Japanese Pat. No. 2011-511715; 10 pages.
JP Claims filed with Japanese Argument and Amendment filed on Oct. 23, 2013; for Japanese Pat. No. 2011-511715; 4 pages.
Letter from Yuasa and Hara dated Nov. 12, 2013; for Japanese Pat. No. 2011-511715; 2 pages.
JP Final Decision of Rejection dated May 9, 2014 for Japanese Patent Application No. 2011-511715; 3 pages.
JP Demand of Appeal and Amendment (in Japanese) (with English claims) filed on Sep. 2, 2014; for Japanese Pat. App. No. 2011-511715; 11 pages.
JP Notice of Reasons for Rejection (English translation) dated May 15, 2015; for Japanese Pat. App. No. 2011-511715; 7 pages.
Letter to Yuasa and Hara dated Jul. 15, 2015; for Japanese Pat. App. No. 2011-511715; 3 pages.
Response (with English Claims) (in Japanese); for Japanese Pat. App. No. 2011-511715; 8 pages.
JP Judgment in Trial with English Translation dated Nov. 16, 2015 (in Japanese); For Japanese Pat. App. No. 2011-511715; 15 pages.
KR Notice to Submit a Response dated Jan. 6, 2015; for Korean Pat. App. No. 10-2010-7029241; 19 pages.
Email from $21^{st}$ Century Patent & Law Firm dated Jan. 6, 2015; for Korean Pat. App. No. 10-2010-7029241; 2 pages.
KR Final Notice to Submit a Response dated Jun. 17, 2015; for Korean Pat. App. No. 10-2010-7029241; 21 pages.
Email from $21^{st}$ Century Patent & Law Firm dated Jun. 18, 2015; for Korean Pat. App. No. 10-2010-7029241; 2 pages.
Letter to $21^{st}$ Century Patent and Law Firm, including claims, dated Jul. 31, 2015; For Korean Pat. App. No. 10-2010-7029241; 12 pages.
Email from $21^{st}$ Century Patent and Law Firm dated Sep. 7, 2015; For Korean Pat. App. No. 10-2010-7029241; 2 pages.
Response and Amendment dated Sep. 7, 2015; For Korean Pat. App. No. 10-2010-7029241; 28 pages.
KR Notice of Decision of Refusal dated Dec. 1, 2015; For Korean Pat. App. No. 10-2010-7029241; 4 pages.
Letter from $21^{st}$ Century Patent and Law Firm dated Dec. 15, 2015; For Korean Pat. App. No. 10-2010-7029241; 2 pages.
Letter from $21^{st}$ Century Patent and Law Firm dated Feb. 11, 2016; For Korean Pat. App. No. 10-2010-7029241; 1 page.
$21^{st}$ Century Patent & Law Firm letter re: Trial Decision Rejection dated Oct. 27, 2017 for KR Pat. Appl. No. 10-2010-7029241; 1 page.
JP Notice of Reasons for Rejection dated Apr. 16, 2015; for Japanese Pat. App. No. 2014-177801; 5 pages.
JP Letter to Yuasa and Hara dated Jul. 6, 2015; for Japanese Pat. App. No. 2014-177801; 33 pages.
JP Response (with claims in English) filed Jul. 15, 2015 (in Japanese); for Japanese Pat. App. No. 2014-177801; 12 pages.
JP Letter from Yuasa and Hara dated Jul. 22, 2015; for Japanese Pat. App. No. 2014-177801; 1 page.
JP Reasons for Rejection dated Dec. 22, 2015 (with English translation); For Japanese Pat. App. No. 2014-177801; 10 pages.
Letter from Yuasa and Hara dated Jan. 26, 2016; For Japanese Pat. App. No. 2014-177801; 3 pages.
Awad et al; "Stacked-Chip Packaging: Electrical, Mechanical, and Thermal Challenges;" IEEE 2004 Electronic Components and Technology Conference, vol. 2; Jun. 2004; 6 pages.
Carson et al; "Stack Die CSP Interconnect Challenges;" Slideshow Presentation, IEEE/CMPT Seminar; date unknown; Sep. 8, 2015, 13 pages.

(56) References Cited

OTHER PUBLICATIONS

Data Sheet; "High-Speed Digital Isolators, AduM1100AR/ AduM1100BR;" as published by Analog Devices, Inc.; 2001, 12 pages.
Daughton "Spin-Dependent Sensors" IEEE, vol. 91, No. 5, May 2003, 6 pages.
"Flip-Chip-Montage;" Wikipedia (with English translation); Aug. 7, 2015; 12 pages.
Hartmann; "Magnetfeldsensoren;" Institut fur Experimentalphysik, Universitat des Saarlandes, Sep. 13, 2015; 2 pages.
Hirota et al.; "Giant Magneto-Resistance Devices;" Springer Series in Surface Sciences, 40; ISBN-10: 3540418199; ISBN-13: 9783540418191, Jan. 1995, 9 pages.
IEEE 100; "The Authoritative Dictionary of IEEE Standards Terms, Seventh Edition;" Feb. 27, 2007; 3 pages.
Intel "The Chip Scale Package (CSP);" Intel 2000 Packaging Databook; Jan. 2000; 16 pages.
Melexis Integrated Systems; "CSA-1V Current Sensor;" www.melexis.com/ProdMain.aspx?nID=614; Aug. 2004; 2 pages.
Mitsui High Tec; "IC Leadframes;" downloaded on Sep. 23, 2011; http://mitsui-high-tec.com/en/prd/lf/index.html; 2 pages.
Partin et al.; "Temperature Stable Hall Effect Sensors;" IEEE Sensors Journal, vol. 6, No. 1; Feb. 2006;5 pages.
PC Magazine Encyclopedia; "Definition of lead frame;" data sheet downloaded Sep. 23, 2011; http://www.pcmag.com/encyclopedia_term/0,2542,t=lead+frame&i=45990,00.asp; 2 pages.
Pernia et al.; "Characteristics and Design of a Current Sensor Using Multilayer Co/Ni Structures;" IEEE, 1998, 6 pages.
Sentron A Melexis Company; "Operation and Application of the Sentron CAS-1V-SO Surface Mount Current Sensor;" Current Sensing with the CSA-1V Hall IC, AN_102; Aug. 2004; 14 pages.
Siliconfareast.com; "Lead Frames;" data sheet downloaded on Sep. 26, 2011; http://www.siliconfareast.com/leadframes.htm; 2 pages.
Takenaga et al.; "High-Temperature Operations of Rotation Angle Sensors with Spin-Valve-Type Magnetic Tunnel Junctions;" IEEE Transactions on Magnetics; vol. 41, No. 10; Oct. 2005; 3 pages.
Taylor, et al.; "A Spin-Valve Based SOIC8 Current Sensor;" Allegro Microsystems, Inc. internal document; Aug. 17, 2006; 5 pages.
"Utilization of GMR Materials. Analog Bridge Output Devices;" pp. 1-3; NVE Corporation on website: www.nve.com/technical/explinations/Bridge.html, 3 pages.
Wikipedia; "Electronic Component;" downloaded Sep. 26, 2011; http://en.wikipedia.org/wiki/Electronic_component; 10 pages.
Xiao et al.: "An Overview of Integratable Current Sensor Technologies;" IEEE Mar. 2003; 0-7803-7883; 8 pages.
U.S. Appl. No. 10/364,442, filed Feb. 11, 2003.
PCT Invitation to Pay Additional Fees; PCT Application No. PCT/US03/34141 dated Apr. 23, 2004; 7 pages.
PCT Search Report; PCT Application No. PCT/US03/34141 dated Jun. 17, 2004; 10 pages.
JP Office Action dated May 26, 2008 for Japanese Appl. No. 2004-568309, 1 page.
Response to JP Office Action dated May 26, 2008 for Japanese Appl. No. 2004-568309 filed Aug. 26, 2008, 16 page.
JP Office Action dated Mar. 23, 2009 for Japanese Appl. No. 2004-568309,2 pages.
Response to JP Office Action dated Mar. 23, 2009 for Japanese Appl. No. 2004-568309 filed Jul. 17, 2009, 13 pages.
JP Office Action dated Nov. 2, 2009 for Japanese Appl. No. 2004-568309,1 page.
U.S. Appl. No. 11/767,631, filed Jun. 25, 2007.
Extended European Search Report dated Sep. 26, 2017 for EP Patent Application No. 11192118.5; 7 pages.
Extended European Search Report dated Sep. 26, 2017 for EP Patent Application No. 11192124.3; 6 pages.
Extended European Search Report dated Oct. 19, 2017 for EP Patent Application No. 11192127.6; 7 pages.
Extended European Search Report dated Oct. 17, 2017 for EP Patent Application No. 11192131.8; 7 pages.

PCT Search Report and Written Opinion of the ISA for PCT/US2006/000363 dated May 5, 2006; 14 pages.
PCT International Preliminary Report on Patentability for PCT/US2006/000363 dated Aug. 16, 2007; 10 pages.
U.S. Appl. No. 10/962,889, filed Oct. 12, 2004.
PCT Search Report and Written Opinion of the ISA for PCT/US2005/029982 dated Jan. 18, 2006; 13 pages.
EP Office Action dated Apr. 25, 2008 for European Appl. No. 05794713.7; 7 pages.
U.S. Appl. No. 11/335,944.
Restriction Requirement dated May 15, 2008 for U.S. Appl. No. 11/335,944; 5 pages.
Response to Restriction Requirement dated May 15, 2008 for U.S. Appl. No. 11/335,944; 1 page.
Office Action dated Apr. 6, 2009 for U.S. Appl. No. 11/335,944; 18 pages.
Response to Office Action dated Apr. 6, 2009 for U.S. Appl. No. 11/335,944, filed Jul. 6, 2009; 17 pages.
Office Action dated Nov. 16, 2009 for U.S. Appl. No. 11/335,944, filed Jul. 6, 2009; 16 pages.
Response to Office Action dated Nov. 16, 2009 for U.S. Appl. No. 11/335,944, filed Dec. 23, 2009; 19 pages.
Notice of Allowance dated Jan. 28, 2010; for U.S. Appl. No. 11/335,944; 6 pages.
312 Amendment filed May 20, 2010; for U.S. Appl. No. 11/335,944; 7 pages.
Response dated Jun. 1, 2010; to 312 Amendment; for U.S. Appl. No. 11/335,944; 2 pages.
PCT Search Report and Written Opinion of the ISA for PCT/US2007/000093 dated Feb. 5, 2008; 13 pages.
PCT Notification Concerning Transmittal of International Preliminary Report on Patentability; for PCT/US2007/000093, dated Jul. 31, 2008, 9 pages.
EP Office Action dated Dec. 5, 2008 for EP Pat. App. No. 07716253.5; 3 pages.
EP Response to Official Communication dated Dec. 5, 2008, for EP Pat. App. No. 07 716 253.5 filed on Jun. 8, 2009; 14 sheets.
EP Official Communication dated Apr. 19, 2011 for European Pat. App. No. 07 716 253.5-2216; 4 pages.
EP Response to Official Communication dated Apr. 19, 2011; for EP Pat. App. No. 07716253.5; filed on Aug. 19, 2011; 9 pages.
EP Notice of Allowance; dated Nov. 8, 2011; for EP Pat. App. No. 07 716 253.5; 7 pages.
EP Notice of Opposition (in German) from the European Patent Office; dated Jan. 14, 2013; with regard to EP Pat. App. No. 07716253.5; 51 pages.
EP Response to the Opposition by Micronas GmbH; for European Pat. No. 1974223; 14 pages.
Letter from A.A. Thornton & Co. to the European Patent Office; dated Aug. 8, 2013; for European Pat. No. 194223; 1 page.
Letter from A.A.Thornton & Co.; dated Feb. 20, 2013; with regard to EP Pat. App. No. 07716253.5; 2 pages.
Letter from Koch Muller dated Sep. 7, 2015; For European Pat. No. EP 1 974 223 B1; 5 pages.
EP Summons to Attend Oral Proceedings and Summary of Facts and Submission dated Feb. 19, 2015; for European Pat. App. No. 07716253.5; 12 pages.
EP Interlocutory Decision in Opposition Proceedings dated Dec. 15, 2015; For European Pat. No. 1974223; 39 pages.
EP Provision of the Minutes in Accordance with Rule 124(4) EPC dated Dec. 15, 2015; For European Pat. No. 1974223; 14 pages.
Response (with First, Second and Third Auxiliary Request Claims) to European Appeal Statement from the Opponent dated Dec. 15, 2015 for European Application No. 077116253.5; Response filed on Sep. 14, 2016; 15 Pages.
Statement of Grounds of Appeal (following opposition); English Translation; European Patent No. EP 1974223 B1; Apr. 25, 2016, 42 pages.
EPO Response to patent proprietor's submission filed on Oct. 13, 2017 for EP Patent No. EP 1974223 B1; 8 pages.
JP Office Action; dated Aug. 3, 2011; for JP Pat. App. No. 2008-551281; 4 pages.

(56) References Cited

OTHER PUBLICATIONS

Response to JP Official Communication; dated Aug. 3, 3011; for JP Pat. App. No. 2008-551281; filed Dec. 9, 2011; 10 pages.
Letter from Yuasa & Hara dated Sep. 16, 2011; for JP Pat. App. No. 2008-551281; 2 pages.
Search Report and Written Opinion dated Dec. 3, 2019 for PCT Application No. PCT/US2019/042921; 15 pages.
Preliminary Amendment filed on Nov. 5, 2018 for U.S. Appl. No. 16/055,644; 8 pages.
Office Action dated Nov. 18, 2019 for U.S. Appl. No. 16/055,644; 18 pages.
Response to Office Action filed on Jan. 17, 2020 for U.S. Appl. No. 16/055,644; 13 pages.
Notice of Allowance dated Feb. 5, 2020 for U.S. Appl. No. 16/055,644; 9 pages.
U.S. Non-Final Office Action dated Jul. 13, 2020 for U.S. Appl. No. 15/999,448; 45 Pages.
Response to U.S. Non-Final Office Action dated Jul. 13, 2020 for U.S. Appl. No. 15/999,448; Response filed on Sep. 9, 2020; 14 Pages.
Notice of Allowance dated Nov. 10, 2020 for U.S. Appl. No. 15/999,448; 8 Pages.
Notice of Allowance dated Jan. 11, 2021 for U.S. Appl. No. 15/999,448; 10 Pages.
European Patent Office Rule 161(1) and 162 EPC dated Feb. 24, 2021 for European Application No. 19755717.6; 3 Pages.
International Preliminary Report on Patentability dated Mar. 4, 2021 for Application No. PCT/US2019/042921; 9 Pages.

* cited by examiner

MULTI-GAIN CHANNELS FOR MULTI-RANGE SENSOR

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a current sensor is provided, comprising: a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit; a first signal processing path coupled to the sensing unit, the first signal processing path including a first compensation unit for adjusting the internal signal, the first signal processing path being configured to generate a first signal based on the internal signal, the first signal being indicative of a value of the electrical current, the first signal having a first error with respect to a first range of values of the electrical current; a second signal processing path coupled to the sensing unit, the second signal processing path including a second compensation unit for adjusting the internal signal, the second signal processing path being configured to generate a second signal based on the internal signal, the second signal being indicative of the value of the electrical current, the second signal having a second error with respect to the first range of values of the electrical current, wherein the second error is lower than the first error.

According to aspects of the disclosure, a current sensor is provided, comprising: a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit; a first signal processing path coupled to the sensing unit, the first signal processing path including a first compensation unit for adjusting the internal signal, the first signal processing path being configured to generate a first signal based on the internal signal, the first signal being indicative of a value of the electrical current, the first signal having a first error with respect to a first range of values of the electrical current; a second signal processing path coupled to the sensing unit, the second signal processing path including a second compensation unit for adjusting the internal signal, the second signal processing path being configured to generate a second signal based on the internal signal, the second signal being indicative of the value of the electrical current, the second signal processing path having a second error with respect to a second range of values of the electrical current; and a combiner configured to generate an output signal based on at least one of the first signal and the second signal.

According to aspects of the disclosure, a current sensor is provided, comprising: a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit; a first signal processing path coupled to the sensing unit, the first signal processing path including a first compensation unit for adjusting the internal signal, the first signal processing path being configured to generate a first signal based on the internal signal, the first signal being indicative of a value of the electrical current, the first signal processing path having a first sensitivity to the internal signal; a second signal processing path coupled to the sensing unit, the second signal processing path including a second compensation unit for adjusting the internal signal, the second signal processing path being configured to generate a second signal based on the internal signal, the second signal being indicative of the value of the electrical current, the second signal processing path having a second sensitivity to the internal signal.

According to aspects of the disclosure, a sensor is provided, comprising: a sensing unit including one or more sensing elements, the sensing unit being arranged to generate, at least in part, an internal signal, the internal signal being generated in response to a magnetic field; a first signal processing path coupled to the sensing unit, the first signal processing path including a first means for adjusting the internal signal, the first signal processing path being configured to generate a first signal based on the internal signal, the first signal being indicative of a value of the magnetic field, the first signal having a first error with respect to a first range of values of the magnetic field; a second signal processing path coupled to the sensing unit, the second signal processing path including a second means for adjusting the internal signal, the second signal processing path being configured to generate a second signal based on the internal signal, the second signal being indicative of a value of the magnetic field, the second signal having a second error with respect to the first range of values of the magnetic field.

BRIEF DESCRIPTION OF THE DRAWINGS

The foregoing features may be more fully understood from the following description of the drawings in which.

DETAILED DESCRIPTION

Figure 1A:
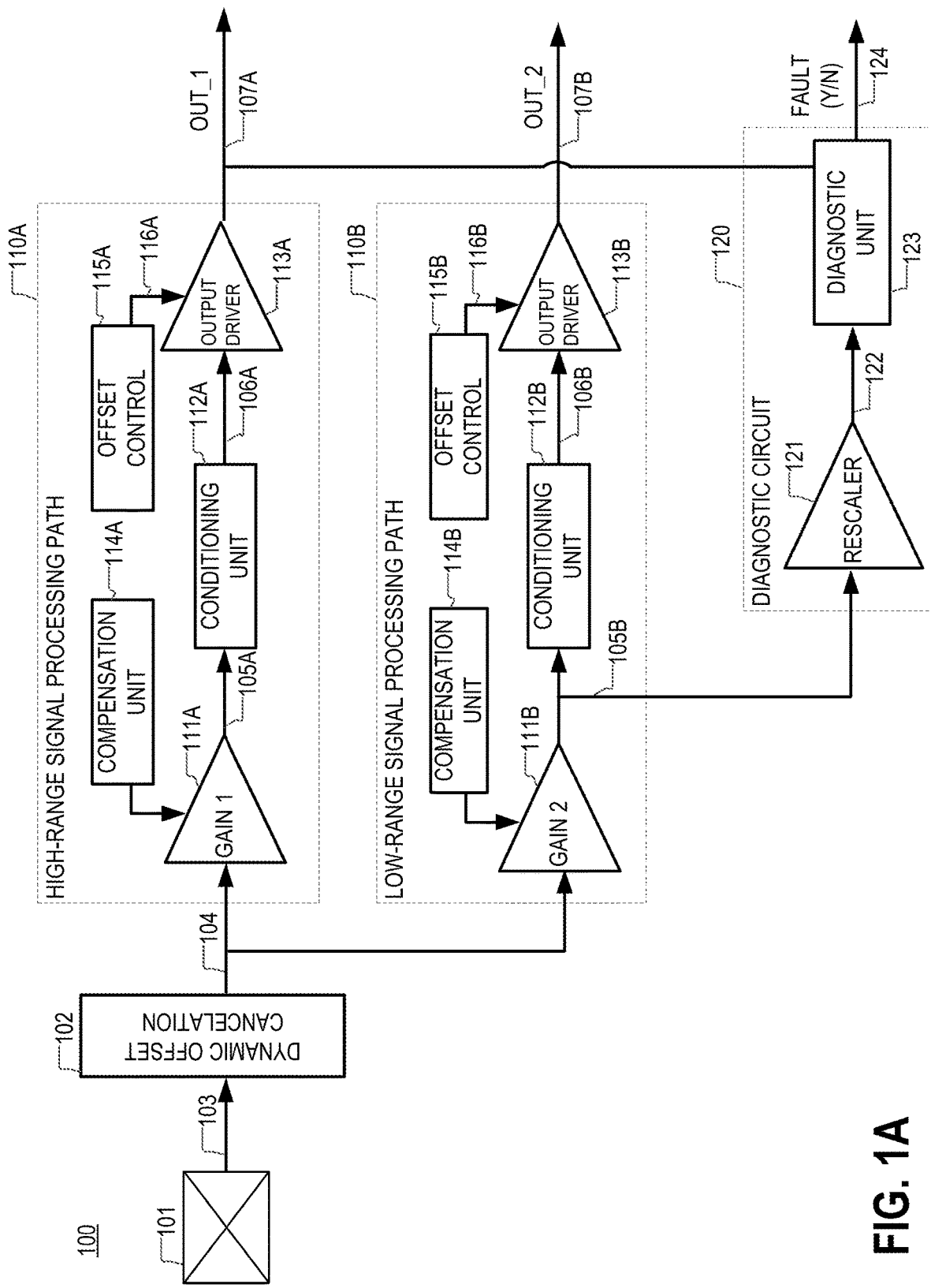
FIG. 1A is a diagram of an example of a sensor having a first signal processing path and a second signal processing path, according to aspects of the disclosure.

According to aspects of the disclosure, a current sensor is disclosed for use in automated control systems. The current sensor may be used to generate one or more control signals, as needed. The current sensor includes at least a first signal processing path and a second signal processing path. Both signal processing paths are coupled to the same sensing element or set of sensing elements. Each signal processing path has different sensitivities, or gains for different ranges of the current that is being measured. The first signal processing path may have a higher sensitivity (than the second signal processing path) in a low range of values of the current being measured. The second signal processing path may have a higher sensitivity (than the first signal processing path) in a high range of values of the current being measured. The outputs of the first and second paths may be routed to different output terminals (or sets of output terminals) of the current sensor. This gives electronic designers the flexibility to use the output of the first signal processing path, when the current being measured is in the low range, and use the output of the second signal processing path when the current being measured is in the low range. According to the present example, the low range may include a range having a lower bound of $L_1$ and an upper bound of $U_1$. The high range may include a range having a lower bound of $L_2$ and an upper bound or $U_2$, wherein at $L_2>L_1$. In some implementations, the low and high range may overlap (e.g., when $U_1>L_2$, etc.). According to another aspect of the disclosure, the current sensor may include an on-die combiner that is configured to combine the outputs of the first and second signal processing paths to produce a combined signal. The combined signal may be equal to the output of the first signal processing path when the current being measured is in the low range. On the other hand, the combined signal may be equal to the second signal when the current being measured is in the high range. The combined signal may be output on one or more output terminals of the current sensor. Across the full range of values of the current that is being measured, the combined signal may have lower overall error than any of the outputs of the first and second signal processing paths. In this regard, outputting the combined signal may help increase the accuracy of the current sensor, while maintaining the pinout of conventional (and less-accurate) current sensors. Having a legacy pinout is advantageous because it could permit the current sensor to be integrated into existing electronic circuits that are designed with conventional (and less-accurate) current sensors in mind. Furthermore, generating such a combined signal can achieve a more accurate sensor output over a wider dynamic range of sensed current values so that a current sensor can accurately accommodate sensing currents that might heretofore require the purchase of different sensors.

The examples of current sensors that are provided throughout the disclosure include two signal processing paths only. However, it will be understood that the concepts and ideas of the present disclosure are not limited to any specific count of signal processing paths being present in a current sensor, for as long as: (i) each of the signal processing paths is associated with a different range of values of the current being measured, and (ii) each of the signal processing paths has a higher sensitivity than the rest for values of the current that fall within the range that is associated with the signal processing path.

FIG. 1A is a diagram of an example of a current sensor 100, according to aspects of the disclosure. As illustrated, the current sensor 100 may include a sensing unit 101, a dynamic offset cancelation unit 102, a signal processing path 110A, a signal processing path 110B, and a diagnostic circuit 120. The sensing unit 101 may include one or more magnetic field sensing elements, and a frequency chopper that is configured to chop a signal that is generated by the magnetic field sensing elements to produce a signal 103. The dynamic offset cancellation unit may demodulate the signal 103 (at the frequency of the chopper) to produce a signal 104. The signal processing path 110A may process the signal 104 to generate a signal 107A. The signal processing path 110B may process the signal 104 to generate an output put signal 107B. The diagnostic circuit 120 may be configured to detect discrepancies in the operation of the signal processing path 110A and the signal processing path 110B to detect the presence of a failure. The diagnostic circuit 120 may output a diagnostic signal 124. When the diagnostic signal 124 is set to a first value, this may indicate that the signal processing path 110A and/or the signal processing path 110B has failed. When the diagnostic signal 124 is set to a second value, this may indicate that the signal processing path 110A and/or the signal processing path 110B are operating correctly.

The signal processing path 110A may include a frontend amplifier 111A, a conditioning unit 112A, an output driver 113A, a compensation unit 114A, and an offset control unit 115A. The frontend amplifier 111A may amplify the signal 104 to produce a signal 105A. The conditioning unit 112A may filter the signal 105A to produce a signal 106A. And the output driver 113A may generate the signal 107A based on the signal 106A.

The compensation unit 114A may include any suitable type of electronic circuitry that is configured to adjust the gain of the frontend amplifier 111A. In some implementations, the compensation unit 114A may be configured to perform temperature compensation in a well-known fashion. Additionally or alternatively, in some implementations, the compensation unit 114A may perform humidity compensation, pressure compensation, and/or any other suitable type of compensation. Stated succinctly, the present disclosure is not limited to any specific implementation of the compensation unit 114A.

The conditioning unit 112A may include one or more filters for filtering the signal 105A. By way of example, the conditioning unit 112A may include a low-pass filter, a moving average filter (e.g., a sinc filter, etc.), and/or any other suitable type of filter. Stated succinctly, the present disclosure is not limited to any specific implementation of the conditioning unit 112A.

The offset control unit 115A may include any suitable type of electronic circuitry that is configured to set the offset of the output driver 113A. In operation, the offset control unit 115A may generate a signal 116A that specifies the offset of output driver 113A. The signal 116A may be generated in a well-known fashion by the offset control unit 115A. In some implementations, the signal 116A may be arranged to compensate for the effects of various environmental factors, such as temperature, humidity, pressure, etc.

The signal processing path 110B may include a frontend amplifier 111B, a conditioning unit 112B, an output driver 113B, a compensation unit 114B, and an offset control unit 115B. The frontend amplifier 111B may amplify the signal 104 to produce a signal 105B. The conditioning unit 112B may filter the signal 105B to produce a signal 106B. And the output driver 113B may generate the signal 107B based on the signal 106B.

The compensation unit 114B may include any suitable type of electronic circuitry that is configured to adjust the gain of the frontend amplifier 111B. In some implementations, the compensation unit 114B may be configured to perform temperature compensation in a well-known fashion. Additionally or alternatively, in some implementations, the compensation unit 114B may perform humidity compensation, pressure compensation, and/or any other suitable type of compensation. Stated succinctly, the present disclosure is not limited to any specific implementation of the compensation unit 114B.

The conditioning unit 112B may include one or more filters for filtering the signal 105B. By way of example, the conditioning unit 112B may include a low-pass filter, a moving average filter (e.g., a sinc filter, etc.), and/or any other suitable type of signal. Stated succinctly, the present disclosure is not limited to any specific implementation of the conditioning unit 112B.

The offset control unit 115B may include any suitable type of electronic circuitry that is configured to set the offset of the output driver 113B. In operation, the offset control unit 115B may generate a signal 116B that specifies the offset of output driver 113B. The signal 116B may be generated in a well-known fashion by the offset control unit 115B. In some implementations, the signal 116B may be arranged to compensate for the effects of various environmental factors, such as temperature, humidity, pressure, etc.

Figure 1B:
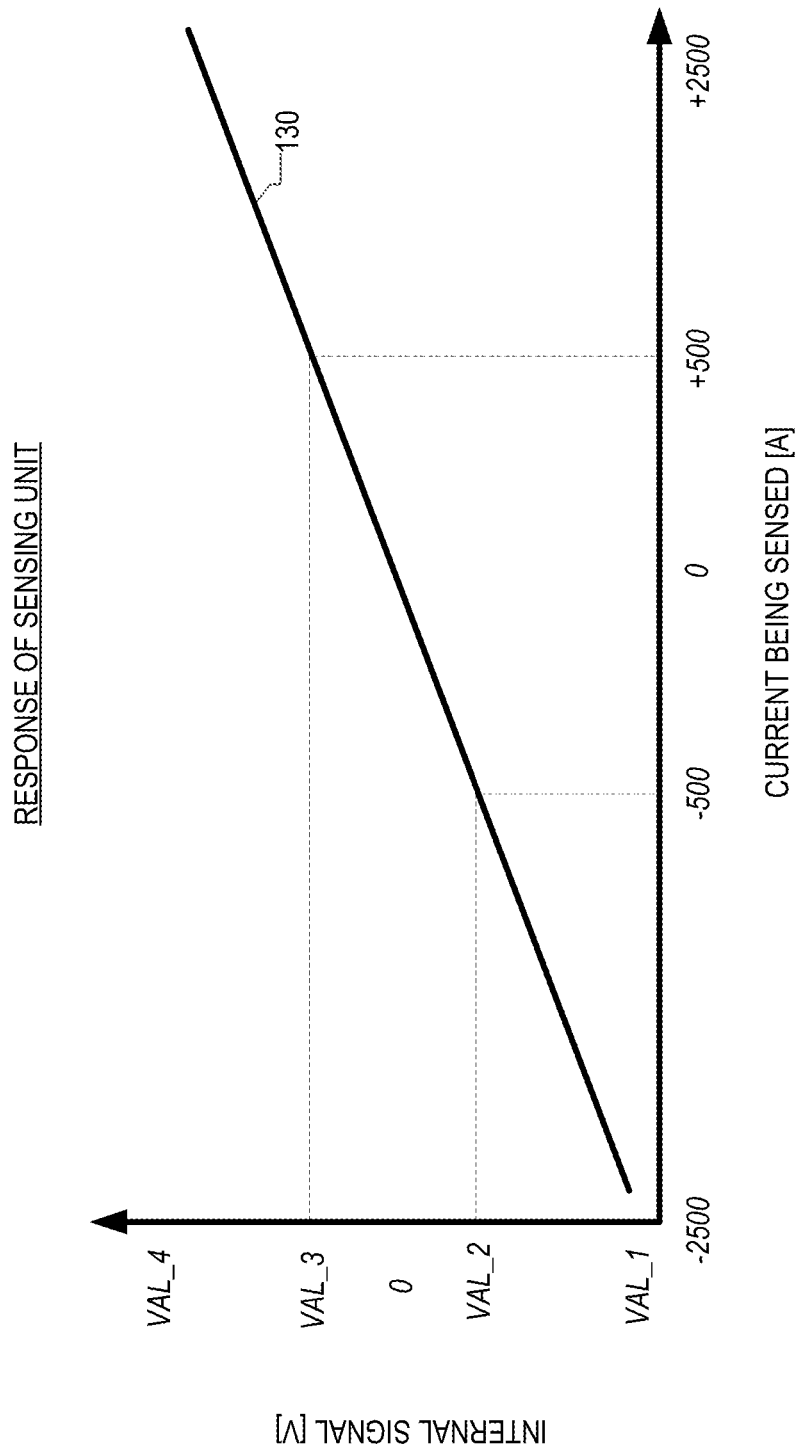
FIG. 1B is a plot of a response of a sensing unit that is part of the sensor of FIG. 1A, according to aspects of the disclosure.

FIG. 1B shows a plot of a curve 130, which shows the response of the sensing unit 101 to an electric current that is being measured with current sensor 100. The Y-axis of the plot represents the value (in volts) of the signal 104 and the X-axis represents the value of the current that is being measured by the current sensor 100. FIG. 1B illustrates that: (i) the signal 104 may have a value VAL_1 when the value of the current is −2500A; (ii) the signal 104 may have a value VAL_2 when the value of the current is −500A; (iii) the signal 104 may have a value VAL_3 when the value of the current is +500A; (iv) the signal 104 may have a value VAL_4 when the value of the current is +2500A. The current values of −2500A, −500A, 500A, and 2500A are provided as an example. It will be understood that each of the values VAL_1, VAL_2, VAL_3, and VAL-4 may correspond to any value of the current being measured.

Figure 1C:
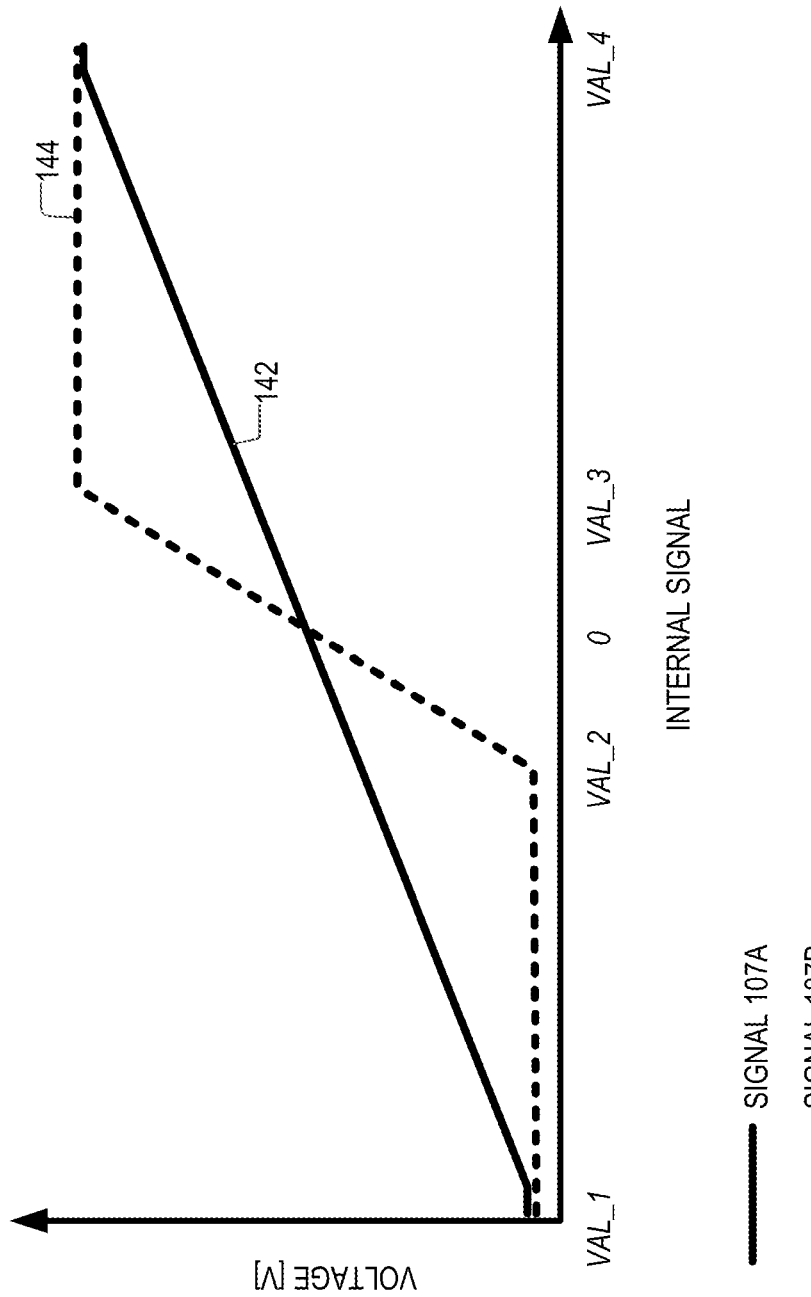
FIG. 1C is a plot of a response of the first and second signal processing paths of the sensor of FIG. 1A, according to aspects of the disclosure.

FIG. 1C is a plot of curves 142 and 144. Curve 142 represents the value of the signal 107A across a set of values of the signal 104, and curve 144 represents the value of the signal 107B across the same set of values of the signal 104. FIG. 1C shows that the signal processing path 110B may have a higher sensitivity than the first signal path 110A for values of the signal 104 that fall in the range of [VAL_2-VAL_3]. It will be recalled that the range [VAL_2-VAL_3] corresponds to current values in the range of [−500A-+500A]. FIG. 1C further shows that the signal processing path 110A may have lower sensitivity than the first signal path 110B for values of the signal 104 that fall in the range [VAL_1-VAL_2]. It will be recalled that the range of [VAL_1-VAL_2] corresponds to current values in the range of [−2500A-500A]. FIG. 1C further shows that the signal processing path 110A may have lower sensitivity than the signal processing path 110B for values of the signal 104 that fall in the range [VAL_3-VAL_4]. It will be recalled that the range of [VAL_3-VAL_4] corresponds to current values in the range of [+500A-+2500A]. The signal 107B, as illustrated in FIG. 1C, is flat for values of the signal 104 in the ranges [VAL_1-VAL_2] and [VAL_3-VAL-4] because the signal processing path 110B is in a saturation area for those values.

Figure 1D:
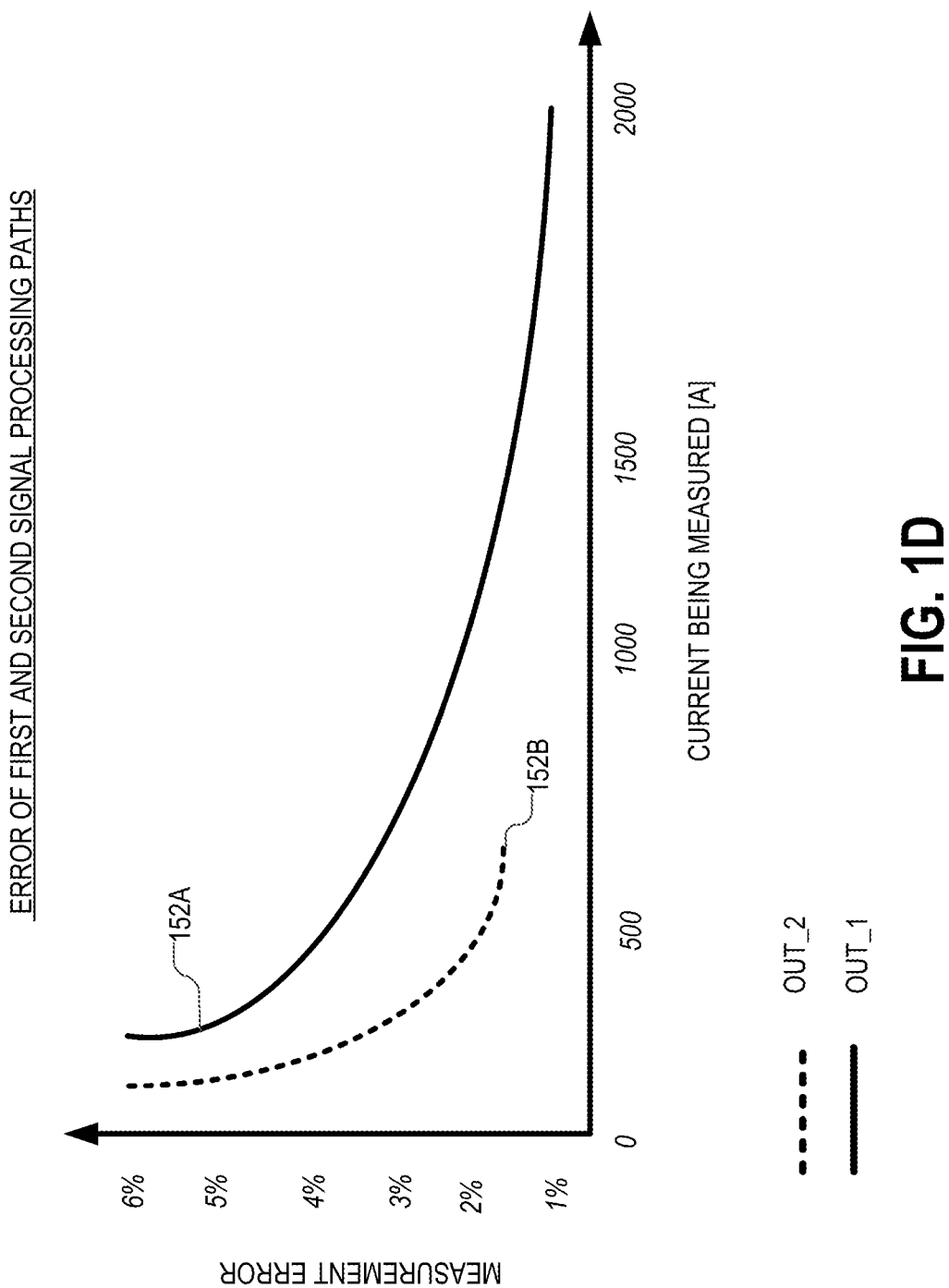
FIG. 1D is a plot of error curves of the first and second signal processing paths of the sensor of FIG. 1A, according to aspects of the disclosure.

FIG. 1D is a plot of curves 152A and 152B, according to one example. Curve 152A represents the error of signal 107A and curve 152B represents the error of signal 107B. Together curves 152A and 152B show that, when the current being measured by the current sensor 100 is in the range of 0-500A, the signal 107B may have lower error than the signal 107A. Furthermore, the curves 152A and 152B show that, when the current being measured by the current sensor 100 is in the range of 500-2500A, the signal 107B may have a higher error than the signal 107A] FIG. 1D, in other words, illustrates that the signal processing paths 110A and 110B may have different errors for different current ranges. It will be understood that the present disclosure is not limited to any specific bounds for the different current ranges. For example, in some implementations, in some implementations, the range of the first signal processing path 110A may be entirely within the range of the signal processing path 110B. In such implementations, the range of signal processing path 110A may have a lower bound that is higher than the lower bound of the range of the signal processing path 110B, and the range of the signal processing path 110A may have an upper bound that is lower than the upper bound of the signal processing path 110B.

To achieve different sensitivities and error curves for the signal processing paths 110A-B, the signal processing path 110A and the signal processing path 110B may be configured differently. For example, in some implementations, the frontend amplifiers 111A and 111B may have different linear response regions. Additionally or alternatively, in some implementations, the compensation units 114A and 114B may be configured to adjust the gain of the signal 104 by a different factor. Additionally or alternatively, in some implementations, the offset control units 115A and 115B may be configured to adjust signals 106A and 106B, respectively, by a different coefficient. Additionally or alternatively, in some implementations, the conditioning units 112A and 112B may have different response functions. Those of ordinary skill in the art will readily recognize, after reading this disclosure, that there are various ways to configure the signal processing paths 110A and 110B to have different error curves for the same current range. Furthermore, it will be understood that the present disclosure is not limited to any specific method for configuring the signal processing paths 110A and 110B to have different error curves (and/or sensitivities) for different current ranges. In some respects, each of signal processing paths 110A and 110B may have a gain that is designed to sense a respective range currents and is optimized to have less error for the range of currents.

The diagnostic circuit 120 may include a rescaler 121 and a diagnostic unit 123. The rescaler 121 may include electronic circuitry that is configured to receive the signal 105B as input and produce a rescaled signal 122. The diagnostic unit 123 may include any suitable type of electronic circuitry that is configured to compare the rescaled signal 122 to the signal 107A and output a diagnostic signal 124 based on an outcome of the comparison. For instance, if the rescaled signal 122 and the signal 107A match, the diagnostic unit 123 may set the diagnostic signal 124 to a value that indicates that the current sensor 100 is operating correctly (e.g., '1'). By contrast, if the rescaled signal 122 and the signal 107A do not match, the diagnostic unit 123 may set the diagnostic signal 124 to a value that indicates that the current sensor 100 is not operating correctly (e.g., '0').

Figure 2A:
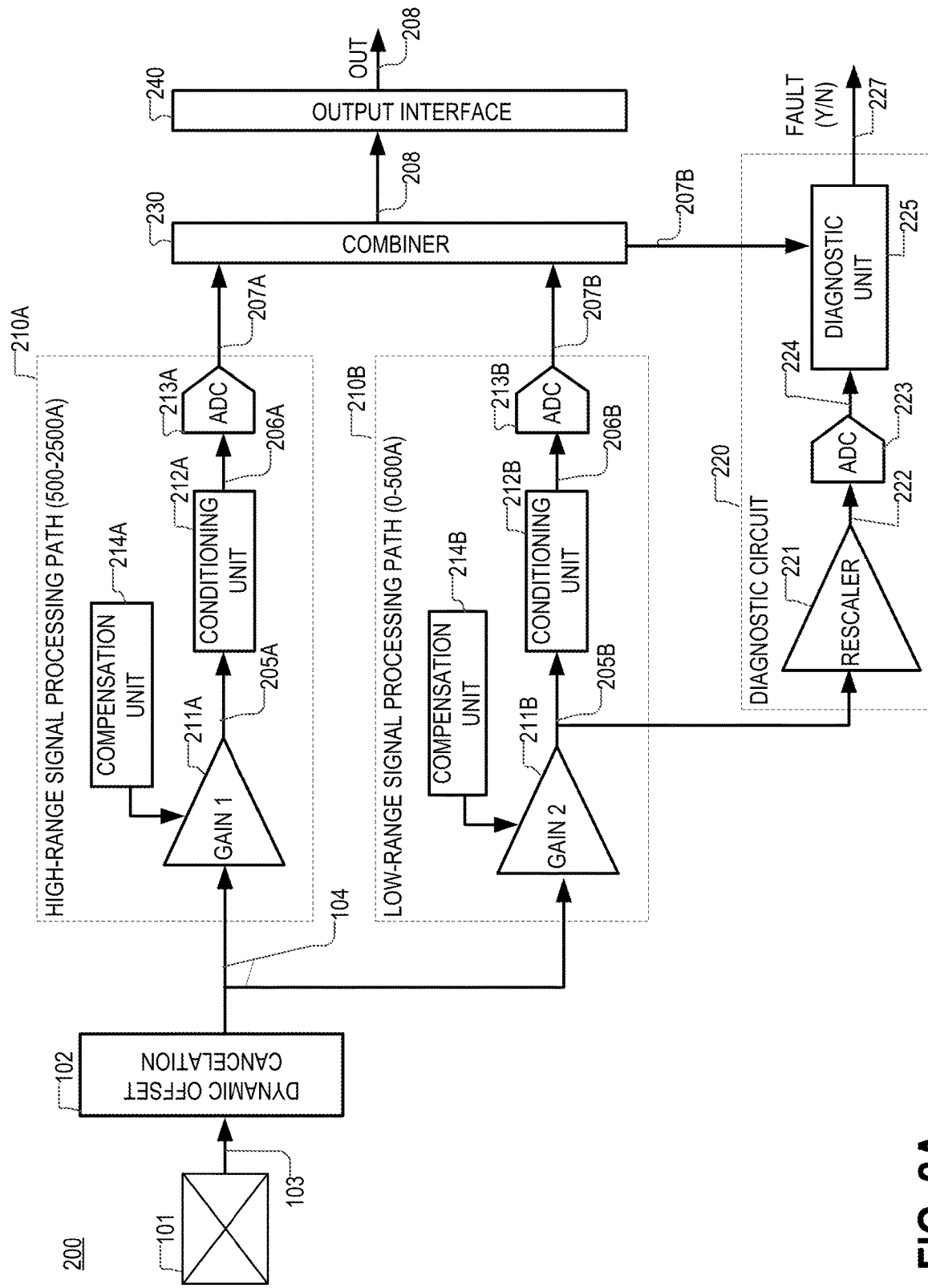
FIG. 2A is a diagram of an example of a sensor having a first signal processing path and a second signal processing path, according to aspects of the disclosure.

FIG. 2A is a diagram of an example of a current sensor 200, according to aspects of the disclosure. The current sensor 200 is similar to the current sensor 100 in that it includes two different signal paths, which receive an input signal that is generated by the same sensing unit, and which have different sensitivities. The current sensor 200 differs from the current sensor 100 in that each of the signal paths of the current sensor 200 is configured to output a digital signal, whereas the signal processing paths of the current sensor 100 output analog signals. Another difference between the current sensor 200 and the current sensor 100 is that the current sensor 200 outputs a combined signal that is produced by combining the signals generated by its signal processing paths, whereas the current sensor 100 outputs the signals that are generated by its signal processing paths, without combining these signals beforehand.

As illustrated the current sensor 200 may include a sensing unit 101, a dynamic offset cancelation unit 102, a signal processing path 210A, a signal processing path 210B, a combiner 230, an output interface 240, and a diagnostic circuit 220.

The sensing unit 101, as noted above with respect to FIG. 1A, may include one or more magnetic field sensing elements, and a frequency chopper that is configured to chop a signal that is generated by the magnetic field sensing elements to produce the signal 103. The dynamic offset cancellation unit 102, as noted above with respect to FIG. 1A, may demodulate the signal 103 (at the frequency of the chopper) to produce the signal 104. The signal processing path 220A may process the signal 104 to generate a signal 207A. The signal processing path 210B may process the signal 104 to generate a signal 207B. The combiner 230 may combine the signals 207A and 207B to produce a signal 208, which is subsequently output by the output interface 240. The output interface 240 may include an I²C interface and/or any other suitable type of interface.

The signal processing path 210A may include a frontend amplifier 211A, a conditioning unit 212A, an analog-to-digital converter (ADC) 213A, and a compensation unit 214A. The frontend amplifier 211A may amplify the signal 104 to produce a signal 205A. The conditioning unit 212A may filter the signal 205A to produce a signal 206A. The ADC 213A may digitize the signal 206A to produce a signal 207A, which is subsequently provided to the combiner 230.

The conditioning unit 212A may include one or more filters for filtering the signal 205A. By way of example, the conditioning unit 212A may include a low-pass filter, a moving average filter (e.g., a sinc filter, etc.), and/or any other suitable type of signal. Stated succinctly, the present disclosure is not limited to any specific implementation of the conditioning unit 212A.

The compensation unit 214A may include any suitable type of electronic circuitry that is configured to adjust the gain of the frontend amplifier 211A. In some implementations, the compensation unit 214A may be configured to perform temperature compensation in a well-known fashion. Additionally or alternatively, in some implementations, the compensation unit 214A may perform humidity compensation, pressure compensation, and/or any other suitable type of compensation. Stated succinctly, the present disclosure is not limited to any specific implementation of the compensation unit 214A.

The signal processing path 220B may include a frontend amplifier 211B, a conditioning unit 212B, an analog-to-digital converter (ADC) 213B, and a compensation unit 214B. The frontend amplifier 211B may amplify the signal 204 to produce a signal 205B. The conditioning unit 212B may filter the signal 205B to produce a signal 206B. The ADC 213B may digitize the signal 206B to produce a signal 207B, which is subsequently provided to the combiner 230.

The conditioning unit 212B may include one or more filters for filtering the signal 205B. By way of example, the conditioning unit 212B may include a low-pass filter, a moving average filter (e.g., a sinc filter, etc.), and/or any other suitable type of signal. Stated succinctly, the present disclosure is not limited to any specific implementation of the conditioning unit 212B.

The compensation unit 214B may include any suitable type of electronic circuitry that is configured to adjust the gain of the frontend amplifier 211B. In some implementations, the compensation unit 214B may be configured to perform temperature compensation in a well-known fashion. Additionally or alternatively, in some implementations, the compensation unit 214B may perform humidity compensation, pressure compensation, and/or any other suitable type of compensation. Stated succinctly, the present disclosure is not limited to any specific implementation of the compensation unit 214B.

Figure 2B:
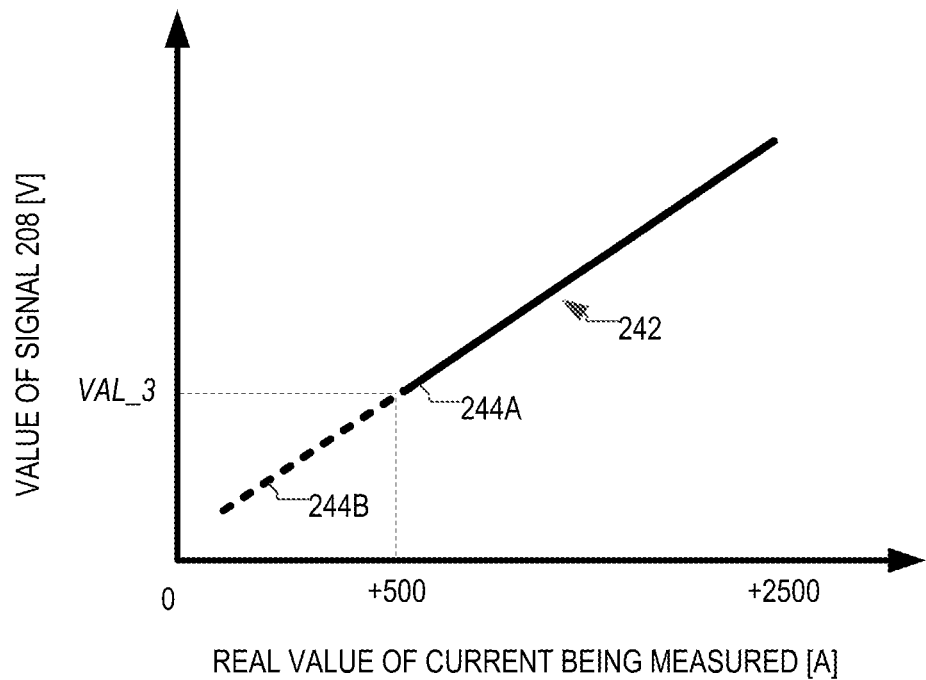
FIG. 2B is a plot of an output signal of the sensor of FIG. 2A, according to aspects of the disclosure.
Figure 2C:
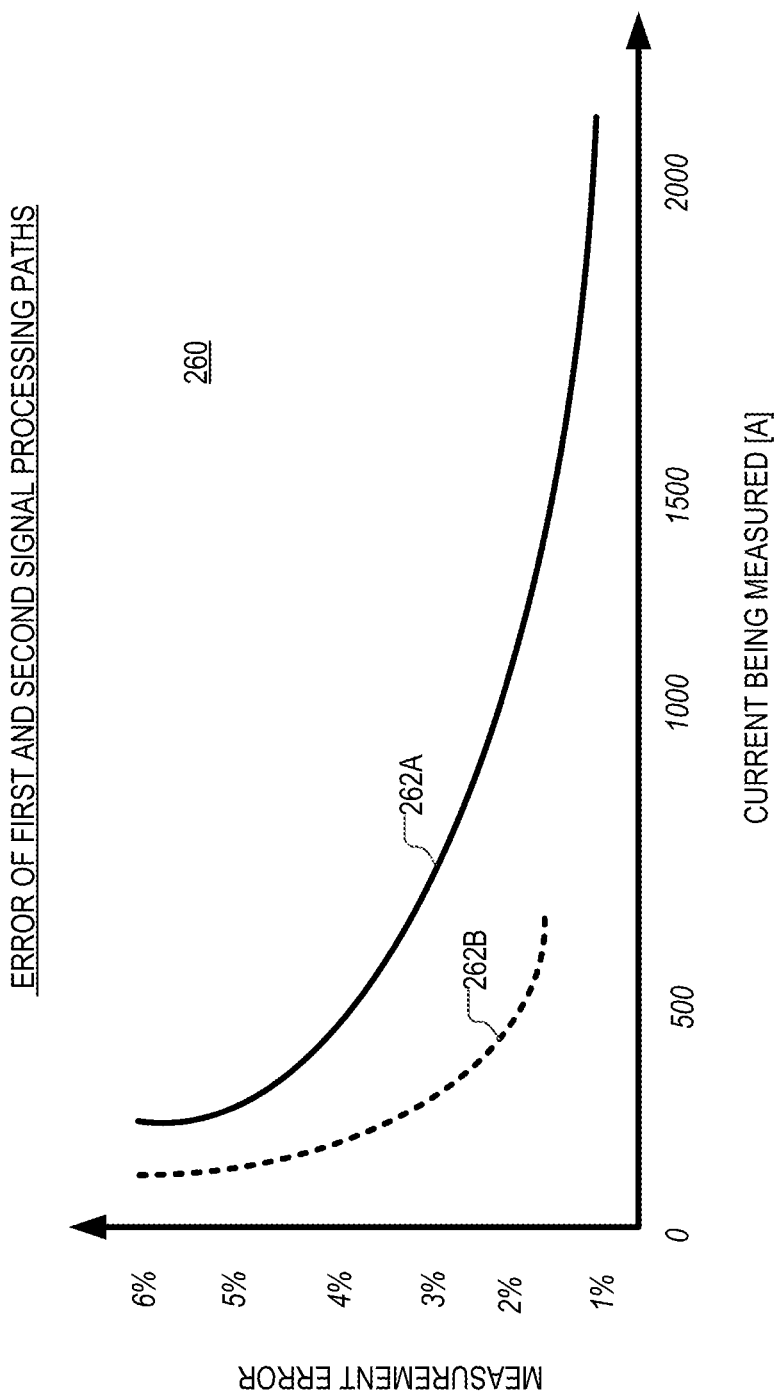
FIG. 2C is a plot of error curves of first and second signal processing paths of the sensor of FIG. 2A, according to aspects of the disclosure.

FIG. 2C is a plot 260 of curves 262A and 262B, according to one example. Curve 262A represents the error of signal 207A and curve 262B represents the error of signal 207B. Together curves 262A and 262B show that, when the current being measured by the current sensor 200 is in the range of 0-500A, the signal 207B may have lower error than the signal 207A. Furthermore, the curves 262A and 262B show that, when the current being measured by the current sensor 200 is in the range of 500-2500A, the signal 207B may have a higher error than the signal 207B. FIG. 2C, in other words, illustrates that the signal processing paths 210A and 210B may have different sensitives for different current ranges. It will be understood that the present disclosure is not limited to any specific bounds for the different current ranges.

To achieve different sensitivities and error curves for the signals 207A and 207B, the signal processing path 210A and the signal processing path 210B may be configured differently. For example, in some implementations, the frontend amplifiers 211A and 211B may have different linear response regions. Additionally or alternatively, in some implementations, to achieve different error curves for the signals 207A and 207B, the compensation units 214A and 214B may be configured to adjust the gain of the signal 204 by a different factor. Additionally or alternatively, in some implementations, to achieve different error curves for the signals 207A and 207B, the conditioning units 212A and 212B may have different response functions. Those of ordinary skill in the art will readily recognize, after reading this disclosure, that there are various ways to configure the signal processing paths 210A and 210B to have different error curves for the same current range. Furthermore, it will be understood that the present disclosure is not limited to any specific method for configuring the signal processing paths 210A and 210B to have different error curves (and/or sensitivities) for different current ranges. In some respects, each of signal processing paths 210A and 210B may have a gain that is designed to sense a respective range currents and is optimized to have less error for the range of currents.

The combiner 230, may include any suitable type of electronic circuitry that is configured to combine the signals 207A and 207B to produce the signal 208. More particularly, the signal 208 may be equal to (or otherwise based on) the signal 207B when the value of the current being measured is less than a predetermined value (e.g., 500A). Moreover, under the same arrangement, the signal 208 may be equal to (or otherwise based on) the signal 207A when the value of the current being measured is greater than a predetermined value (e.g., 500A). FIG. 2B shows a plot of a curve 242, which relates the signal 208 to different values of the current that is being measured by the current sensor 200. The curve 242 includes portions 244A and 244B. As noted above, in some implementations, values of the signal 208 that fall within the portion 244A may be generated based on the signal 207A (but not based on the signal 207B). Similarly, values of the signal 208 that fall within the portion 244B may be generated based on the signal 207B. In operation, when at least one of the signals 207A and 207B indicates that the value of the current being measured is below a predetermined value (e.g., 500A), the combiner 230 may set the signal 208 to equal the signal 207B. On the other hand, when at least one of the signals 207A and 207B indicates that the value of the current being measured is above the predetermined value (e.g., 500A), the combiner 230 may set the signal 208 to equal the signal 207A. In some implementations, the combiner 230 may also adjust the offset of the signal 208 before the signal 208 is provided to the output interface 240.

Returning to FIG. 2A, the diagnostic circuit 220 may include a rescaler 221, an ADC 223, and a diagnostic unit 225. The rescaler 121 may include electronic circuitry that is configured to receive the signal 205B as input and produce a rescaled signal 222. The rescaled signal 222 may be digitized by the ADC to produce a signal 224. If the current sensor 200 is operating correctly, the signal 224 may match the signal 207B. On the other hand, if the current sensor 200 is experiencing a failure, the signal 224 would not match the signal 207B. The diagnostic unit 225 may include any suitable type of electronic circuitry that is configured to compare the signal 224 to the signal 207B and generate a diagnostic signal 227 based on an outcome of the comparison. For instance, if the rescaled signal 222 and the signal 207B match, the diagnostic unit 225 may set the diagnostic signal 227 to a value that indicates that the current sensor 200 is operating correctly (e.g., '1'). By contrast, if the signal 224 and the signal 207B do not match, the diagnostic unit 225 may set the diagnostic signal 227 to a value that indicates that the current sensor 200 is not operating correctly (e.g., '0').

Figure 3A:
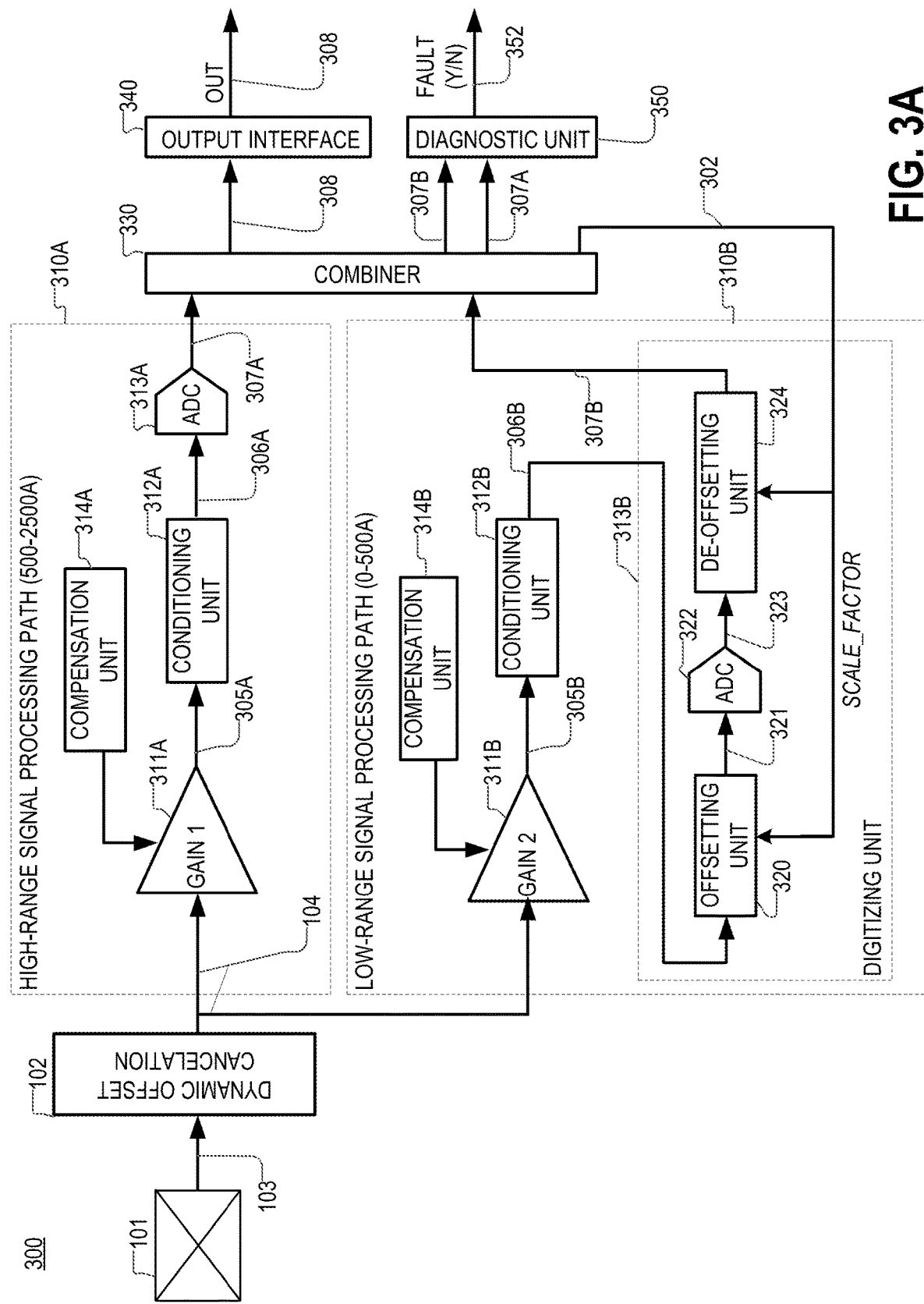
FIG. 3A is a diagram of an example of a sensor having a first signal processing path and a second signal processing path, according to aspects of the disclosure.

FIG. 3A is a diagram of an example of a current sensor 300, according to aspects of the disclosure. The current sensor 300 is similar to the current sensor 200 in that two different signal paths, receive an input signal that is generated by the same sensing unit and have different sensitivities. However, unlike the current sensor 200, one of the signal processing paths of the current sensor 300 includes a digitizing unit that is configured to (i) offset (in the analog domain) an analog signal to fit within the dynamic range of an ADC that is arranged to digitize the analog signal and (ii) de-offset (in the digital domain) the output of the ADC by the same amount in order to return the digitized signal back to the original level of the analog signal.

The current sensor 300 may include a sensing unit 101, a dynamic offset cancelation unit 102, a signal processing path 310A, a signal processing path 310B, a combiner 330, an output interface 340, and a diagnostic unit 350.

The sensing unit 101, as noted above with respect to FIG.1A, may include one or more magnetic field sensing elements, and a frequency chopper that is configured to chop a signal that is generated by the magnetic field sensing elements to produce the signal 103. The dynamic offset cancellation unit 102, as noted above with respect to FIG. 1A, may demodulate the signal 103 (at the frequency of the chopper) to produce the signal 104. The signal processing path 220A may process the signal 104 to generate a signal 307A. The signal processing path 310B may process the signal 104 to generate a signal 307B. The combiner 330 may combine the signals 307A and 307B to produce a signal 308, which is subsequently output by the output interface 340. The output interface 340 may include an I²C interface and/or any other suitable type of interface.

The signal processing path 310A may include a frontend amplifier 311A, a conditioning unit 322A, an analog-to-digital converter (ADC) 313A, and a compensation unit 314A. The frontend amplifier 311A may amplify the signal 104 to produce a signal 305A. The conditioning unit 312A may filter the signal 305A to produce a signal 306A. The ADC 313A may digitize the signal 306A to produce a signal 307A, which is subsequently provided to the combiner 330.

The conditioning unit 312A may include one or more filters for filtering the signal 305A. By way of example, the conditioning unit 312A may include a low-pass filter, a moving average filter (e.g., a sinc filter, etc.), and/or any other suitable type of signal. Stated succinctly, the present disclosure is not limited to any specific implementation of the conditioning unit 312A.

The compensation unit 314A may include any suitable type of electronic circuitry that is configured to adjust the gain of the frontend amplifier 311A. In some implementations, the compensation unit 314A may be configured to perform temperature compensation in a well-known fashion. Additionally or alternatively, in some implementations, the compensation unit 314A may perform humidity compensation, pressure compensation, and/or any other suitable type of compensation. Stated succinctly, the present disclosure is not limited to any specific implementation of the compensation unit 314A.

The signal processing path 320B may include a frontend amplifier 311B, a conditioning unit 322B, a digitizing unit 313B, and a compensation unit 314B. The frontend amplifier 311B may amplify the signal 104 to produce a signal 305B. The conditioning unit 312B may filter the signal 305B to produce a signal 306B. The digitizing unit 313B may digitize the signal 306B to produce the signal 307B, which is subsequently provided to the combiner 230.

The conditioning unit 312B may include one or more filters for filtering the signal 305B. By way of example, the conditioning unit 312 may include a low-pass filter, a moving average filter (e.g., a sinc filter, etc.), and/or any other suitable type of signal. Stated succinctly, the present disclosure is not limited to any specific implementation of the conditioning unit 312B.

The compensation unit 314B may include any suitable type of electronic circuitry that is configured to adjust the gain of the frontend amplifier 311B. In some implementations, the compensation unit 314B may be configured to perform temperature compensation in a well-known fashion. Additionally or alternatively, in some implementations, the compensation unit 314B may perform humidity compensation, pressure compensation, and/or any other suitable type of compensation on the signal 104. Stated succinctly, the present disclosure is not limited to any specific implementation of the compensation unit 314B.

The digitizing unit 313B may include an offsetting unit 320, an ADC 322, and a de-offsetting unit 324. The offsetting unit 320 may identify an offset value based on a scale factor signal 302 that is provided to digitizing unit 313B by the combiner 330. The offsetting unit 320 may then subtract the offset value from the signal 306B to produce a signal 321. The ADC 322 may digitize the signal 321 to produce a signal 323. The de-offsetting unit 324 may determine the offset value based on the scale factor signal 302. The de-offsetting unit 324 may then add the offset value to the signal 323 to produce the signal 307B. In some respect, subtracting the offset value from the signal 306B may allow the offset version of signal 306A (i.e., the signal 321) to fit within the linear range of the ADC 322. After the offset version of the signal 306B is digitized (i.e., after the signal 323 is produced), adding the offset value back to the digitized and offset version of the signal (i.e., adding the offset value to the signal 323) may return the digitized version of the signal back to the original value of the signal. In some respects, using the offsetting unit 320 and the de-offsetting unit 324 may help in simplifying the design of the ADC 322, as well as the sensor 300. Specifically, the offsetting unit allows the signal that is input into the ADC to always remain in the linear range of the ADC and never clip. Without the offsetting unit 320 and the de-offsetting unit 324, the linear range of the ADC 322 would have to be as wide as the signal to be measured, which can be difficult to achieve without compromising resolution and linearity.

Figures 3B, 3C:
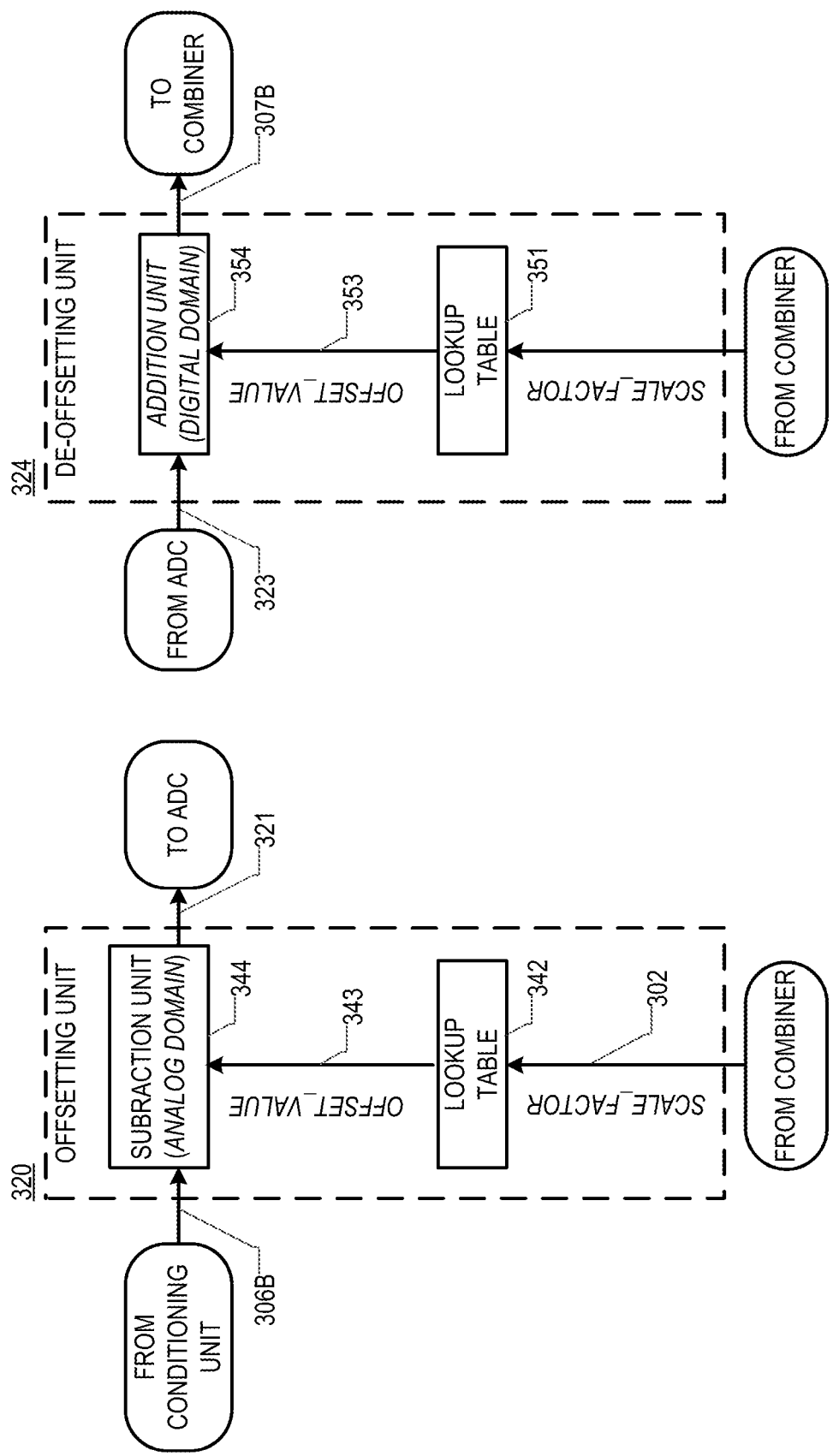
FIG. 3B is a diagram of an example of an offsetting unit that is part of the sensor of FIG. 3A, according to aspects of the disclosure.
FIG. 3C is a diagram of an example of a de-offsetting unit that is part of the sensor of FIG. 3A, according to aspects of the disclosure.

FIG. 3B shows the offsetting unit 320 in further detail. As illustrated, the offsetting unit 320 may include a lookup table 342 and a subtraction unit 344. The lookup table 342 may be configured to map each of a plurality of scale factor values to a respective offset value. The lookup table 342 may receive the scale factor signal 302 and output an offset value 343 that corresponds to the scale factor that is represented by the scale factor signal 302. The subtraction unit 344 may receive the signal 306B and the offset value 343 as input. The subtraction unit 344 may subtract the offset value 343 from the signal 306B to produce the signal 321. According to the example of FIG. 3B, the subtraction unit 344 is implemented in the analog domain.

FIG. 3C shows the de-offsetting unit 324 in further detail. As illustrated, the de-offsetting unit 324 may include a lookup table 351 and an addition unit 354. The lookup table 351 may be configured to map each of a plurality of scale factor values to a respective offset value. The lookup table 351 may receive the scale factor signal 302 and output an offset value 353 that corresponds to the scale factor that is represented by the scale factor signal 302. The offset value 353 may be the same as the offset value 343. The addition unit 354 may receive the signal 323 and the offset value 353 as input. The addition unit 354 may add the offset value 353 to the signal 323 to produce the signal 307B. According to the example of FIG. 3C, the addition unit 354 is implemented in the digital domain.

In some implementations, the scale factor and offset value may be determined in accordance with Equations 1 and 2 below:

$$\text{scale\_factor} = \frac{(signal_{307A} - (signal_{307A} \% R))}{R} \quad (1)$$

$$\text{offset\_value} = R * \text{scale\_factor} \quad (2)$$

where R is the range of the signal processing path 310B and $signal_{307A}$ is the value of signal 307A. The range R of the signal processing path may be between 0 and VAL3. It will be recalled that VAL3 is the value of signal 307B when the current being measured by the sensing element 101 is equal to 500A. In other words, in some implementations, the scale factor may be equal (or otherwise based on) the number of times the signal 307A exceeds the range R of the signal processing path 310B.

Figure 3D:
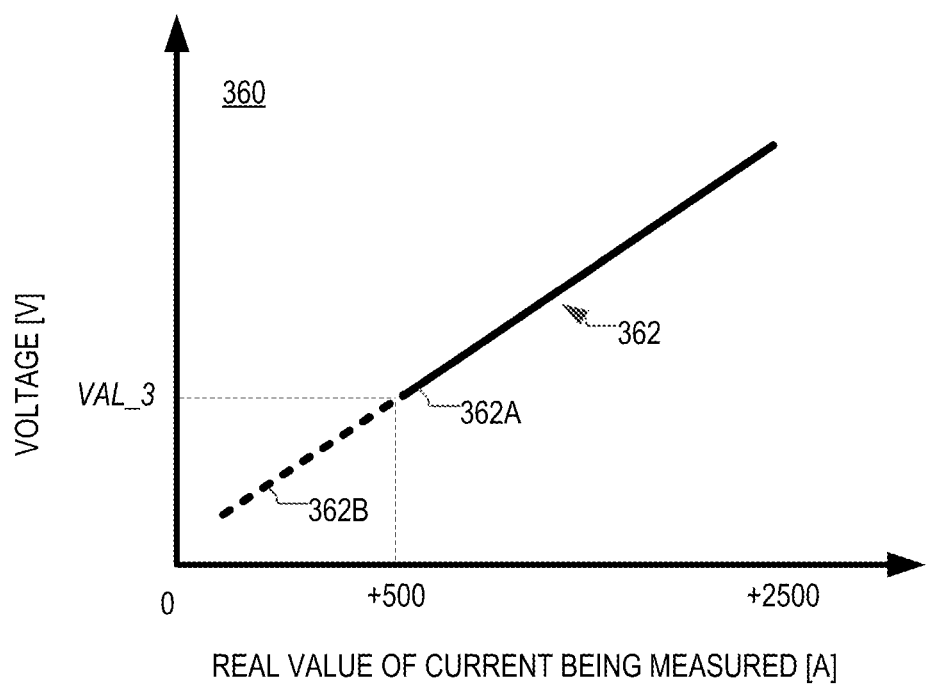
FIG. 3D is a plot of an output signal of the sensor of FIG. 3A, according to aspects of the disclosure.

The combiner 330 may include any suitable type of electronic circuitry that is configured to combine the signals 307A and 307B to produce the signal 308. More particularly, the signal 308 may be equal to (or otherwise based on) the signal 307B when the value of the current being measured is less than a predetermined value (e.g., 500A). Furthermore, the signal 308 may be equal to (or otherwise based on) the signal 307A when the value of the current being measured is greater than a predetermined value (e.g., 500A). FIG. 3D shows a plot of a curve 362 which relates the signal 308 to different values of the current that is being measured by the current sensor 300. The curve 362 includes portions 362A and 362B. As noted above, in some implementations, values of the signal 308 that fall within the portion 362A may be generated based on the signal 307A (but not based on the signal 307B). Similarly, values of the signal 308 that fall within the portion 362B may be generated based on the signal 307B. In operation, when at least one of the signals 307A and 307B indicates that the value of the current being measured is below a predetermined value (e.g., 500A), the combiner 330 may set the signal 308 to equal the signal 207B. On the other hand, when at least one of the signals 307A and 307B indicates that the value of the current being measured is above the predetermined value (e.g., 500A), the combiner 330 may set the signal 308 to equal the signal 307A. In some implementations, the combiner 330 may also adjust the offset of the signal 308 before the signal 308 is provided to the output interface 340.

Figure 3E:
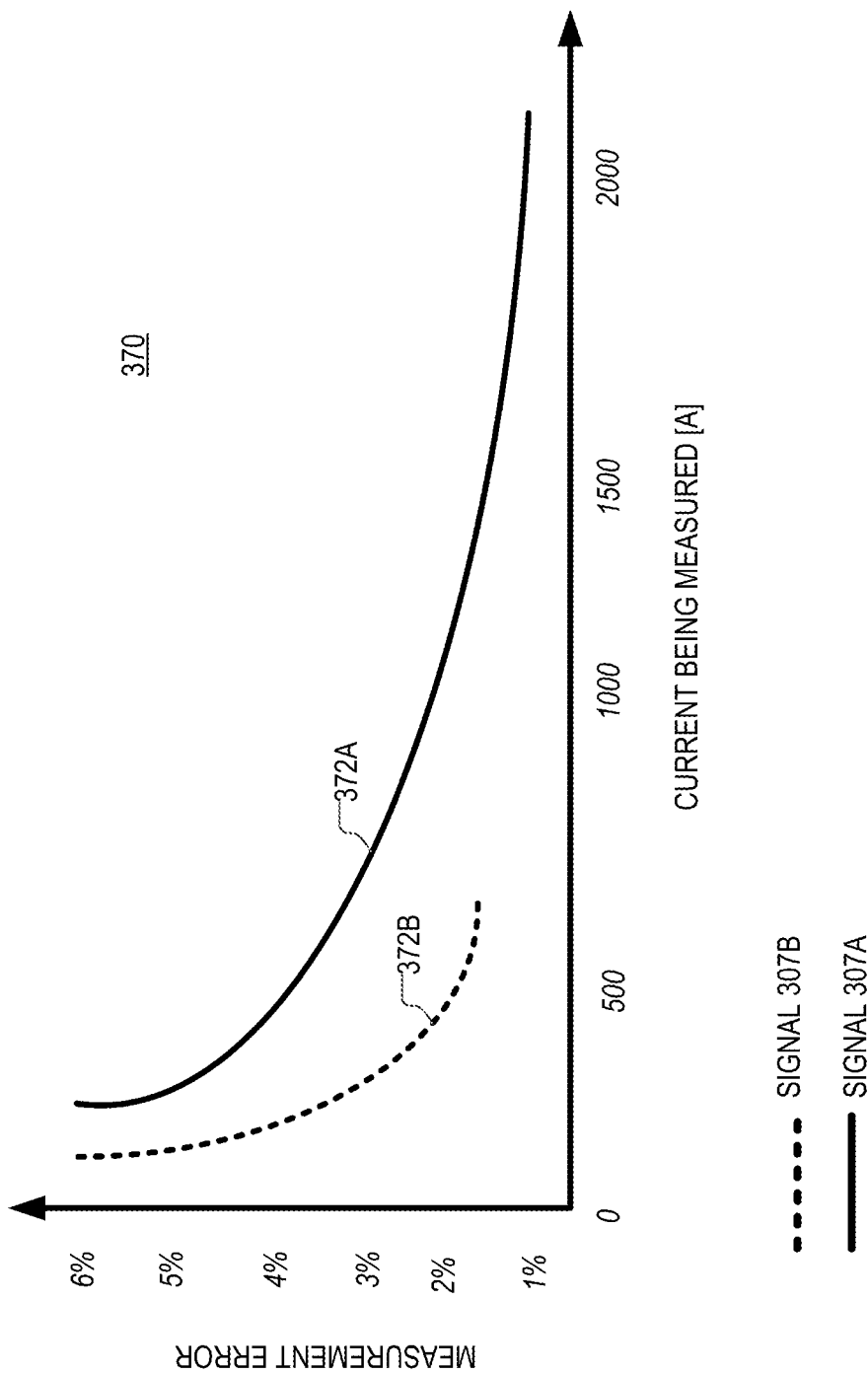
FIG. 3E is a plot of error curves of first and second signal processing paths of the sensor of FIG. 3A, according to aspects of the disclosure.

FIG. 3E is a plot 370 of curves 372A and 372B, according to one example. Curve 372A represents the error of the signal 307A and curve 372B represents the error of the signal 307B. Together curves 372A and 372B show that, when the current being measured by the current sensor 300 is in the range of 0-500A, the signal 307B may have lower error than the signal 307A. Furthermore, the curves 372A and 372B show that, when the current being measured by the current sensor 300 is in the range of 500-2500A, the signal 307B may have a higher error than the signal 307A. FIG. 3E, in other words, illustrates that the signal processing paths 310A and 310B may have different sensitives for different current ranges. It will be understood that the present disclosure is not limited to any specific bounds for the different current ranges.

To achieve different sensitivities and error curves for the signals 307A and 307B, the signal processing path 310A and the signal processing path 310B may be configured differently. For example, in some implementations, the frontend amplifiers 311A and 311B may have different linear response regions. Additionally or alternatively, in some implementations, to achieve different error curves for the signals 307A and 307B, the compensation units 314A and 314B may be configured to adjust the gain of the signal 104 by a different factor. Additionally or alternatively, in some implementations, to achieve different error curves for the signals 307A and 307B, the conditioning units 312A and 312B may have different response functions. Those of ordinary skill in the art will readily recognize, after reading this disclosure, that there are various ways to configure the signal processing paths 310A and 310B to have different error curves for the same current range. Furthermore, it will be understood that the present disclosure is not limited to any specific method for configuring the signal processing paths 310A and 310B to have different error curves (and/or sensitivities) for different current ranges. In some respects, each of signal processing paths 110A and 110B may have a gain that is designed to sense a respective range currents and is optimized to have less error for the range of currents.

The diagnostic unit 350 may include any suitable type of electronic circuitry that is configured to compare the signal 307A to the signal 307B and generate a diagnostic signal 352 based on an outcome of the comparison. For instance, if a difference between signals 307A and 307B is within a predetermined threshold, the diagnostic unit 350 may set the diagnostic signal 352 to a first value (e.g., '1'). On the other hand, if the difference between signals 307A and 307B exceeds the threshold, the diagnostic unit 350 may set the diagnostic signal 352 to a second value (e.g., '0'). The diagnostic signal 350 may be used to detect the occurrence of a failure in the current sensor 300.

According to the present disclosure, each of the circuits shown in FIGS. 1A, 2A, and 3B is an integrated circuit that is formed on a single die and is housed in the same semiconductor packaging. However, alternative implementations are possible in which any of the circuits is a discrete circuit or a circuit that is formed on more than one semiconductor die. Stated succinctly, the present disclosure is not limited to any specific implementations of the circuits shown in FIGS. 1A, 2A, and 3A.

The concepts and ideas discussed throughout the disclosure are not limited to current sensors in particular. For example, the circuits shown in FIGS. 1A, 2A, and 3A can be part of linear position sensors, speed sensors, angular position sensors, and/or any other suitable type of sensor. According to the present disclosure, the signal processing paths discussed with respect to FIGS. 1A, 2A and 3A are coupled to a set of magnetic field sensing elements. However, alternative implementations are possible in which the signal processing paths are coupled to another type of sensing element(s) such as optical sensing element(s), pressure sensing element(s), temperature sensing element(s), etc.

The term "unit" as used throughout the present disclosure shall refer to an electronic component and/or an electronic circuit that include one or more electronic components. In some implementations, the electronic components may include analog components (e.g., electronic components that operate in the analog domain). Additionally or alternatively, in some implementations, the electronic components may include digital logic and/or electronic components that operate in the digital domain. Additionally or alternatively, in some implementations, the electronic components may include digital logic that is configured to execute a sensor firmware. It will be understood that the meaning of the term "compensation unit" includes, but not limited to the examples provided throughout the disclosure. It will be understood that the meaning of the term "conditioning unit" includes, but not limited to the examples provided throughout the disclosure. It will be further understood that the meaning of the term "offsetting unit" includes, but not limited to the examples provided throughout the disclosure. It will be further understood that the meaning of the term "de-offsetting unit" includes, but not limited to the examples provided throughout the disclosure. Stated succinctly, the term "unit," as used throughout the disclosure is not intended to be construed as means-plus-function language.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A current sensor, comprising:
a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit;
a first signal processing path coupled to the sensing unit, the first signal processing path including a first compensation unit for adjusting a gain of the internal signal, the first signal processing path being configured to generate a first signal based on the internal signal, the first signal being indicative of a value of the electrical current; and
a second signal processing path coupled to the sensing unit, the second signal processing path including a second compensation unit for adjusting the gain of the internal signal, the second signal processing path being configured to generate a second signal based on the internal signal, the second signal being indicative of the value of the electrical current,
wherein the first compensation unit and the second compensation unit are configured to adjust the gain of the internal signal by different factors, thereby causing the first signal to have a lower error than the second signal with respect to a first range of values of the electrical current, and a higher error than the second signal with respect to a second range of values of the electrical current.

2. The current sensor of claim 1, wherein:
the first range includes a low range of values and the second range includes a high range of values;
the first signal is output by a first output driver, the first output driver being controlled by a first offset control unit; and
the second signal is output by a second output driver, the second output driver being controlled by a second offset control unit.

3. The current sensor of claim 1, further comprising a combiner that is configured to generate an output signal based on at least one of the first signal and the second signal.

4. The current sensor of claim 1, wherein the first signal processing path has a first sensitivity to the internal signal, and the second signal processing path has a second sensitivity to the internal signal.

5. The current sensor of claim 1, wherein the first signal is configured to represent a wider range of electrical current values than the second signal.

6. The current sensor of claim 1, wherein the first signal represents a first range of electrical current values and the second signal represents a second range of electrical current values that encompasses the first range.

7. The current sensor of claim 1, wherein the first signal processing path includes a first amplifier having a first linear region, and the second signal processing path includes a second amplifier having a second linear region that is different than the first linear region.

8. The current sensor of claim 1, wherein:
the first signal processing path includes a first amplifier and the first compensation unit is configured to control a gain of the first amplifier; and
the second signal processing path includes a second amplifier and the second compensation unit is configured to control a gain of the second amplifier.

9. The current sensor of claim 1, further comprising a diagnostic unit that is configured to compare the first signal to the second signal and output an indication of an error based on an outcome of the comparison.

10. A current sensor, comprising;
a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit;
a first signal processing path coupled to the sensing unit, the first signal processing path including a first compensation unit for adjusting the internal signal, the first signal processing path being configured to generate a first signal based on the internal signal, the first signal being indicative of a value of the electrical current, the first signal having a first error with respect to a first range of values of the electrical current; and
a second signal processing path coupled to the sensing unit, the second signal processing path including a second compensation unit for adjusting the internal signal, the second signal processing path being configured to generate a second signal based on the internal signal, the second signal being indicative of the value of the electrical current, the second signal having a second error with respect to the first range of values of the electrical current, wherein the second error is lower than the first error,
wherein: the first signal processing path includes a first analog-to-digital converter (ADC), the second signal processing path includes a second ADC that is interposed between an offsetting unit and a de-offsetting unit, the offsetting unit being configured to subtract an offset value from a signal that is input in the second ADC and the de-offsetting unit being configured to add the offset value to a signal that is output from the second ADC, and the offset value is based on a factor by which an upper range of the internal signal exceeds a range of the second ADC.

11. A current sensor, comprising:
a diagnostic unit;
a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit;
a first signal processing path coupled to the sensing unit, the first signal processing path including a first compensation unit for adjusting the internal signal, the first signal processing path being configured to generate a first signal based on the internal signal, the first signal being indicative of a value of the electrical current, the first signal having a first error with respect to a first range of values of the electrical current; and
a second signal processing path coupled to the sensing unit, the second signal processing path including a second compensation unit for adjusting the internal signal, the second signal processing path being configured to generate a second signal based on the internal signal, the second signal being indicative of the value of the electrical current, the second signal having a second error with respect to the first range of values of the electrical current, wherein the second error is lower than the first error, wherein: the first signal processing path includes a first amplifier, the second signal processing path includes a second amplifier, and the diagnostic unit is configured to rescale a signal that is output from the second amplifier to produce a rescaled second signal, compare the first signal to the rescaled second signal, and output an indication of an error based on an outcome of the comparison.

12. A current sensor, comprising:

a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit;

a first signal processing path coupled to the sensing unit, the first signal processing path including a first compensation unit for adjusting the internal signal, the first signal processing path being configured to generate a first signal based on the internal signal, the first signal being indicative of a value of the electrical current, the first signal having a first error with respect to a first range of values of the electrical current;

a second signal processing path coupled to the sensing unit, the second signal processing path including a second compensation unit for adjusting the internal signal, the second signal processing path being configured to generate a second signal based on the internal signal, the second signal being indicative of the value of the electrical current, the second signal processing path having a second error with respect to a second range of values of the electrical current; and a combiner configured to generate an output signal based on at least one of the first signal and the second signal, wherein the combiner is configured to set a value of the output signal to a value of the first signal when the value of the electrical current, as indicated by the first signal and/or the second signal, is less than a threshold, and wherein the combiner is configured to set a value of the output signal to a value of the second signal when the value of the electrical current, as indicated by the first signal and/or the second signal, is greater than the threshold.

13. The current sensor of claim 12, wherein the first signal processing path has a first sensitivity to the internal signal, and the second signal processing path has a second sensitivity to the internal signal.

14. The current sensor of claim 12, wherein:

the first signal processing path includes a first amplifier and the first compensation unit is configured to control a gain of the first amplifier; and the second signal processing path includes a second amplifier and the second compensation unit is configured to control a gain of the second amplifier.

15. A current sensor, comprising:

a sensing unit including one or more sensing elements, the sensing unit being arranged to generate, at least in part, an internal signal, the internal signal being generated in response to a magnetic field, the magnetic field being produced, at least in part, by an electrical current that is sensed with the sensing unit;

a first signal processing path coupled to the sensing unit, the first signal processing path including a first compensation unit for adjusting the internal signal, the first signal processing path being configured to generate a first signal based on the internal signal, the first signal being indicative of a value of the electrical current, the first signal having a first error with respect to a first range of values of the electrical current;

a second signal processing path coupled to the sensing unit, the second signal processing path including a second compensation unit for adjusting the internal signal, the second signal processing path being configured to generate a second signal based on the internal signal, the second signal being indicative of the value of the electrical current, the second signal processing path having a second error with respect to the first range of values of the electrical current; and a combiner configured to generate an output signal based on at least one of the first signal and the second signal, wherein the first signal processing path includes a first analog-to-digital converter (ADC) that is disposed downstream from the combiner, wherein the second signal processing path includes a second ADC that is interposed between an offsetting unit and a de-offsetting unit, the second ADC, the offsetting unit, and the de-offsetting unit being disposed downstream from the combiner, the offsetting unit being configured to subtract an offset value from a signal that is input in the second ADC and the de-offsetting unit being configured to add the offset value to a signal that is output from the second ADC, and wherein the offset value is based on a factor by which an upper range of the internal signal exceeds a range of the second ADC.

* * * * *

UNITED STATES PATENT AND TRADEMARK OFFICE
CERTIFICATE OF CORRECTION

PATENT NO. : 11,567,108 B2
APPLICATION NO. : 17/218783
DATED : January 31, 2023
INVENTOR(S) : Loïc André Messier It is certified that error appears in the above-identified patent and that said Letters Patent is hereby corrected as shown below:

In the Specification

Column 1, Line 8 delete "or magnetic" and replace with --or more magnetic--.

Column 3, Line 43 delete "or $U_2$" and replace with --of $U_2$--.

Column 3, Line 43 delete ",wherein at" and replace with --wherein--.

Column 4, Line 28 delete "output put" and replace with --output--.

Column 5, Line 31 delete "signal." and replace with --filter.--.

Column 5, Line 57 delete "VAL-4" and replace with --VAL_4--.

Column 6, Line 2 delete "the first signal" and replace with --the signal--.

Column 6, Line 6 delete "[-2500A-500A]." and replace with --[-2500A--500A].--.

Column 6, Line 25 delete "107A]" and replace with --107A.--.

Column 6, Lines 30-31 delete "in some implementations,".

Column 6, Line 62 delete "range currents" and replace with --range of currents--.

Column 7, Line 41 delete "220A" and replace with --210A--.

Column 7, Line 60 delete "signal." and replace with --filter.--.

Column 8, Line 7 delete "220B" and replace with --210B--.

Signed and Sealed this
Twelfth Day of March, 2024

*Katherine Kelly Vidal*

Katherine Kelly Vidal
*Director of the United States Patent and Trademark Office*

CERTIFICATE OF CORRECTION (continued)
U.S. Pat. No. 11,567,108 B2

Column 8, Line 11 delete "204" and replace with --104--.

Column 8, Line 19 delete "signal." and replace with --filter.--.

Column 8, Line 42 delete "207B." and replace with --207A.--.

Column 9, Line 2 delete "range currents" and replace with --range of currents--.

Column 9, Line 36 delete "121" and replace with --221--.

Column 9, Line 51 delete "224" and replace with --222--.

Column 10, Line 13 delete "220A" and replace with --310A--.

Column 10, Line 21 delete "322A," and replace with --312A,--.

Column 10, Line 32 delete "signal." and replace with --filter.--.

Column 10, Line 46 delete "320B" and replace with --310B--.

Column 10, Line 47 delete "322B," and replace with --312B,--.

Column 10, Line 53 delete "230." and replace with --330.--.

Column 10, Line 56 delete "312" and replace with --312B--.

Column 10, Line 58 delete "signal." and replace with --filter.--.

Column 12, Line 13 delete "VAL3." and replace with --VAL_3.--.

Column 12, Line 14 delete "VAL3" and replace with --VAL_3--.

Column 12, Line 42 delete "207B" and replace with --307B.--.

Column 13, Line 18 delete "110A and 110B" and replace with --310A and 310B--.

Column 13, Line 19 delete "range currents" and replace with --range of currents--.

Column 13, Line 27 delete "(e.g., 1')." and replace with --(e.g., '1')--.

Column 13, Line 31 delete "350" and replace with --352--.

Column 14, Line 43 delete ", volatile" and replace with --or, a volatile memory.--.